United States Patent
Kikushima

[11] Patent Number: 5,912,592
[45] Date of Patent: Jun. 15, 1999

[54] PIEZOELECTRIC OSCILLATOR

[75] Inventor: Masayuki Kikushima, Suwa, Japan

[73] Assignee: Seiko Epson Corporation, Tokyo, Japan

[21] Appl. No.: 08/765,062

[22] PCT Filed: Apr. 24, 1995

[86] PCT No.: PCT/JP95/00801

§ 371 Date: Mar. 26, 1997

§ 102(e) Date: Mar. 26, 1997

[87] PCT Pub. No.: WO96/01524

PCT Pub. Date: Jan. 18, 1996

[30] Foreign Application Priority Data

| Jul. 4, 1994 | [JP] | Japan | 6-152301 |
| Oct. 12, 1994 | [JP] | Japan | 6-246492 |

[51] Int. Cl.$^6$ ............................. H03B 1/00; H03B 5/32
[52] U.S. Cl. ................................. 331/68; 331/158
[58] Field of Search ........................ 331/68, 158

[56] References Cited

U.S. PATENT DOCUMENTS

| 5,302,921 | 4/1994 | Shigemori et al. | 331/68 |
| 5,327,104 | 7/1994 | Kikushima | 331/68 |
| 5,592,130 | 1/1997 | Ikeda et al. | 331/68 |
| 5,631,609 | 5/1997 | Oka et al. | 331/68 |

FOREIGN PATENT DOCUMENTS

| 54-168166 | 11/1979 | Japan. |
| 63-24841 | 2/1988 | Japan. |
| 63-263902 | 10/1988 | Japan. |
| 1-70420 | 5/1989 | Japan. |
| 1-184941 | 7/1989 | Japan. |
| 1-146549 | 10/1989 | Japan. |
| 4-3609 | 1/1992 | Japan. |
| 4-225268 | 8/1992 | Japan. |
| 4-294624 | 10/1992 | Japan. |
| 7-122937 | 5/1995 | Japan. |

*Primary Examiner*—David Nelms
*Assistant Examiner*—Trong Phan
*Attorney, Agent, or Firm*—Oliff & Berridge, PLC

[57] ABSTRACT

A piezoelectric oscillator in which a resonator accommodating a piezoelectric element, such as a quartz crystal resonator or a SAW resonator, in a case thereof and an IC chip, such as an IC for PLL, electrically connected to the resonator are integrally molded by molding resin. Extending radiating leads are provided for an island of a lead frame, in which the IC chip is disposed, and a portion of the radiating leads is exposed out of the molding resin so that the heat generated in the IC chip is positively radiated. Radiating leads are also attached to the case of the resonator to project out of the molding resin so that heat conducted to the case is radiated to minimize influence of heat upon the piezoelectric element. In an oscillator, the size of which has been reduced and the frequency of which has been raised, heat generated in the IC chip is radiated to the outside of the molding resin so that a rise in the temperature of the oscillator is minimized. Thus, an oscillator can be realized which exhibits excellent accuracy and reliability for a long time and which is adaptable to high frequencies.

49 Claims, 18 Drawing Sheets

FIG. 5

| TERMINAL S0 | TERMINAL S1 | TERMINAL S2 | OUTPUT FREQUENCY |
|---|---|---|---|
| 1 | 1 | 1 | 1.343 MHz |
| 1 | 1 | 0 | 14.318 MHz |
| 1 | 0 | 1 | 16.0 MHz |
| 0 | 1 | 1 | 24.0 MHz |
| 1 | 0 | 0 | 40.0 MHz |
| 0 | 1 | 0 | 50.0 MHz |
| 0 | 0 | 1 | 66.6 MHz |
| 0 | 0 | 0 | 80.0 MHz |

PIEZOELECTRIC OSCILLATOR

BACKGROUND OF THE INVENTION

1. Field of the Invention

The present invention relates to a piezoelectric oscillator having a resonator, which comprises a piezoelectric element, and a semiconductor integrated circuit apparatus, such as an IC or an LSI, which is connected to the resonator.

2. Description of Related Art

Piezoelectric oscillators formed by packaging a resonator and a semiconductor integrated circuit apparatus are classified into some types. A piezoelectric oscillator 10 shown in FIGS. 27(a) and 27(b) comprises a resonator 50 having a piezoelectric element, such as a quartz crystal resonator or a SAW resonator, sealed in a substantially cylindrical case 51; and an IC chip 60 in parallel to the resonator. The foregoing units are molded with molding resin 1 into a substantially rectangular shape so as to be formed into a surface-mounting plastic packaging type oscillator.

The piezoelectric oscillator 10 comprises a lead frame 70 having an island 71 which is molded into a plate-like shape and to which the IC chip 60 is secured by an electroconductive adhesive or the like. Electrodes 61 of the chip 60 and input/output leads 72 disposed around the island 71 are connected to one another by wire bonding lines 79. Two resonator leads 52 extend outside the case 51 that accomadates a quartz crystal resonator or a SAW resonator. The resonator leads 52 are connected to portions of the electrodes 61 of the IC chip 60 through connection leads 73 of the lead frame. The lead frame 70 that includes the resonator 50, the IC chip 60 and the leads for a variety of purposes is sealed by epoxy resin molding material 1 by a transfer molding method or the like so that an integrated piezoelectric oscillator is formed.

FIG. 28(a) and FIG. 28(b) show a piezoelectric oscillator 20, in which an IC chip 60, a lead frame 70 and a resonator 50 are sequentially laminated in the foregoing sequential order, and which is sealed into a substantially rectangular shape by a molding resin 1. Also in the foregoing piezoelectric oscillator 20, the IC chip 60 is secured to an island 71 by an electroconductive adhesive, and electrodes 61 of the chip 60 and respective leads are connected to one another by wire bonding lines 79 similarly to the foregoing piezoelectric oscillator 10. A case 51 of the resonator 50 is disposed on the island 71 opposite the IC chip 60, and resonator leads 52 extending from the case 51 are, connected to the IC chip 60 through connection lead 73. In the piezoelectric oscillator 20, the resonator 50, the IC chip 60 and the lead frame 70 are sealed by epoxy resin molding material 1 by a transfer molding method or the like, while stacked thereby reducing the area required for mounting to be accomplished.

However, the diameter of the cylindrical case is at least about 2 mm and, therefore, the overall thickness of the package is about 3.2 to 4.5 mm when considering the thickness of the lead frame 70 and the IC chip 60. Therefore, the height of the package sometimes raises a problem when the package is mounted on small and light electronic equipment or an OA apparatus, such as an FDD, an HDD, a domestic-use facsimile machine or a portable telephone.

Note that the structure of the IC chip and the resonator being disposed opposite each other on the island has also been illustrated in Japanese Patent Laid-Open No. 5-243471.

FIG. 29 shows a piezoelectric oscillator 30 which is not integrated by using the molding resin but in which an IC chip 60 and a quartz crystal resonator or a SAW resonator 53 are directly accommodated and packaged in a ceramic package 31. In the piezoelectric oscillator 30, the IC chip 60 is disposed on a bottom surface 32 of the ceramic case 31 so as to be, by a wire bonding lines 79, connected to a circuit (not shown) printed in the ceramic case. The quartz crystal resonator or the SAW resonator 53 is disposed on the IC chip 60 and are sealed by a metal or ceramic cover 39.

The foregoing piezoelectric oscillator has been employed as a clock source for use in electronic equipment, such as a computer. To meet the trend of the rising operation speeds of electronic equipment, the output frequency has been raised to a high region of about 50 MHz to 125 MHz. In recent years, piezoelectric oscillators each using a SAW resonator, that is capable of stably oscillating at high range frequencies, have been further realized, as well as oscillators each using a quartz crystal resonator. Oscillators of the foregoing type must stably maintain the high output frequencies of about 100 MHz to 500 MHz.

In proportion to the oscillation frequency, the electric power consumption of a semiconductor integrated circuit apparatus, such as an IC, for use in the piezoelectric oscillator is increased. The foregoing state is shown in FIG. 30. When the power supply voltage is 5 V for example, the piezoelectric oscillator consumes an electric current of about 38 mA if the frequency is 80 MHz, about 45 mA if the same is 100 MHz, and about 55 mA if the same is 125 MHz. These values are two to three times a values of about 10 mA to 17 mA of the conventional piezoelectric oscillator when its frequency output is about 20 MHz to 30 MHz.

It is well known that the heat generated by an IC is directly porportional to the power consumption of that IC. Since the heat generation of the IC is increased when the electric power consumption of the IC is increased, the temperature of the piezoelectric oscillator is undesirably raised. If the temperature in the piezoelectric oscillator is raised, the temperature of the junction portion in the IC is raised and, thus, portions of the IC are sometimes damaged. Additionally, characteristics of the IC are sometimes changed, which may adversely affect the reliability and the quality of the IC. If the temperature in the piezoelectric oscillator is raised to a level higher than the range in which the quartz crystal resonator or the SAW resonator, there sometimes arises a problem in that the accuracy of the oscillation frequency deteriorates and an abnormal frequency change takes place. If the piezoelectric oscillator is continuously operated in a state where the temperature is high, the reliability for a long time deteriorates due to accelerated aging.

Additionally, the size and thickness of the electronic equipment having the piezoelectric oscillator mounted thereon have been further reduced, and thus there arises a desire for reducing the size and thickness of the piezoelectric oscillator. Moreover, the oscillation frequency is raised, thus causing the heat generation of the IC accommodated in the smaller package to be increased. Therefore, the temperature in the package rises even more rapidly. It is necessary to overcome this problem of heat generation while providing a high quality piezoelectric oscillator capable of stable operation. Thus, heat generated in the package must be appropriately radiated.

SUMMARY OF THE INVENTION

The present invention is a piezoelectric oscillator capable of stably and accurately supplying high frequencies. In particular, a piezoelectric oscillator, of this invention is adaptable to electronic equipment, the operation speed of which has been raised and the size of which has been reduced, and is capable of minimizing a rise in temperature due to heat generation while stably supplying high frequencies in a small package. Furthermore, a piezoelectric oscillator of the present invention minimizes a rise in its temperature during operation to maintain reliability for a long time.

Throughout this specification, the Applicant has used the term "radiating" or "radiation" and it is to be understood that the term as used in this specification encompasses more than one mode of heat discharge or emission. Therefore, "radiating" or "radiation" is to be understood to include other modes of heat discharge such as conduction or convection, unless otherwise specified.

In the present invention, a radiating portion is exposed outside the molding resin is a semiconductor integrated circuit that generates a large quantity of heat or for an oscillator that is easily affected by a rise in the temperature. That is, the piezoelectric oscillator according to the present invention is a piezoelectric oscillator comprising a resonator, in which a piezoelectric element is sealed in a case thereof; and a semiconductor integrated circuit apparatus disposed on an island of a lead frame, wherein the semiconductor integrated circuit apparatus is connected to the oscillator by at least a portion of leads or the like forming the lead frame, and the resonator, the semiconductor integrated circuit apparatus and the lead frame are integrally molded by molding resin, the piezoelectric element having at least to the outside of the molding resin.

The foregoing radiating portions can be formed by connecting radiating leads that extend outside of the molding resin to the island or case. A radiating plate having at least a portion that exposed to the molding resin may be brought into contact with the island or the case. At least a portion of the island or the case may be exposed to the outside of the molding resin. By stacking the island, the semiconductor integrated circuit apparatus and the resonator in this sequential order, a portion of the island can easily be exposed outside the molding resin, and as well as the packaging size can be reduced.

By providing the foregoing radiating portions for the island, heat generated in the semiconductor integrated circuit apparatus, such as an IC chip, can be directly radiated to the outside of the molding resin so that an excellent heat radiation effect can be obtained. Therefore, heat generated in the semiconductor integrated circuit apparatus can be radiated without storing the heat in the piezoelectric oscillator. By minimizing a rise in the temperature in the piezoelectric oscillator, the influence of heat upon the semiconductor integrated circuit apparatus can be minimized, and the heat that is conducted to the resonator can be reduced. By providing the radiating portions to the case, heat generated by the semiconductor integrated circuit apparatus can be directly radiated to the outside of the molding resin. Therefore, heat conduction to the piezoelectric device in the case can be minimized, and therefore stable oscillation and reliability for a long time can be maintained. Furthermore, since heat in the piezoelectric oscillator can be radiated to the outside through the case, a rise in the temperature of the piezoelectric oscillator can be minimized, and, thus, influence of heat on the semiconductor integrated circuit apparatus can be minimized.

In a piezoelectric oscillator, when a resonator is molded in molding resin parallel to a semiconductor integrated circuit that is thinner than the diameter (the thickness) of the resonator case, thereby enabling the size differential to be used to accommodate a heat sink. Even in a small and thin piezoelectric oscillator, a heat sink can be provided while maintaining the small size of the resonator improving heat radiation effect.

To minimize a rise in the temperature of the oscillator, leads connected to the resonator may be exposed to the outside of the molding resin. If there is a risk of an influence of moisture on the outside of the molding resin on the semiconductor integrated circuit apparatus, the resonator leads or a portion of an electroconductive passage of the lead frame connected to the resonator leads may be disposed adjacent to the surface of the molding resin except the exposed portion of the cut portion to improve the heat radiation effect while limiting the influence of the moisture.

In a piezoelectric resonator, when an oscillator and a semiconductor integrated circuit apparatus are accommodated in a ceramic package, a portion of an island pattern for disposing the semiconductor integrated circuit apparatus formed in a first layer of the package may be extended to be exposed to the outside of the package so that an excellent heat radiation effect can be obtained.

These inventions will be described further in detail with reference to the drawings, and other objects and effects of the present invention will now be described hereinafter and in claims of the present invention.

BRIEF DESCRIPTION OF THE DRAWINGS

FIG. 5 is a table showing a method of selecting the oscillation frequency of the IC for PLL shown in FIG. 4;

FIG. 25b is a front view of the piezoelectric oscillator of FIG. 25a;

FIG. 25c is a right side view of the piezoelectric oscillator of FIG. 25a;

FIG. 26b is a front view of the piezoelectric oscillator of FIG. 26a;

FIG. 26c is a right side view of the piezoelectric oscillator of FIG. 26a;

FIG. 27b is a front view of the piezoelectric oscillator of FIG. 27a;

FIG. 28b is a front view of the piezoelectric oscillator of FIG. 28a;

DETAILED DESCRIPTION OF PREFERRED EMBODIMENTS

Figure 1:
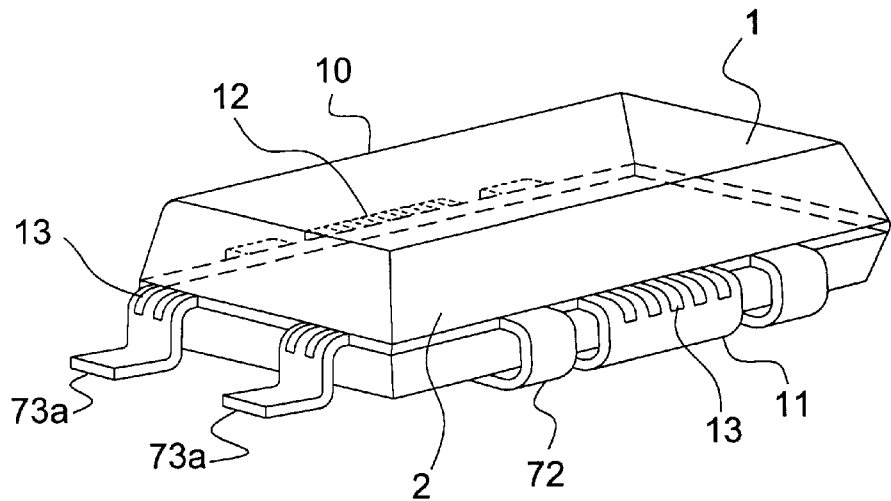
FIG. 1 is a perspective view of a piezoelectric oscillator according to a first embodiment of the present invention.
Figure 2:
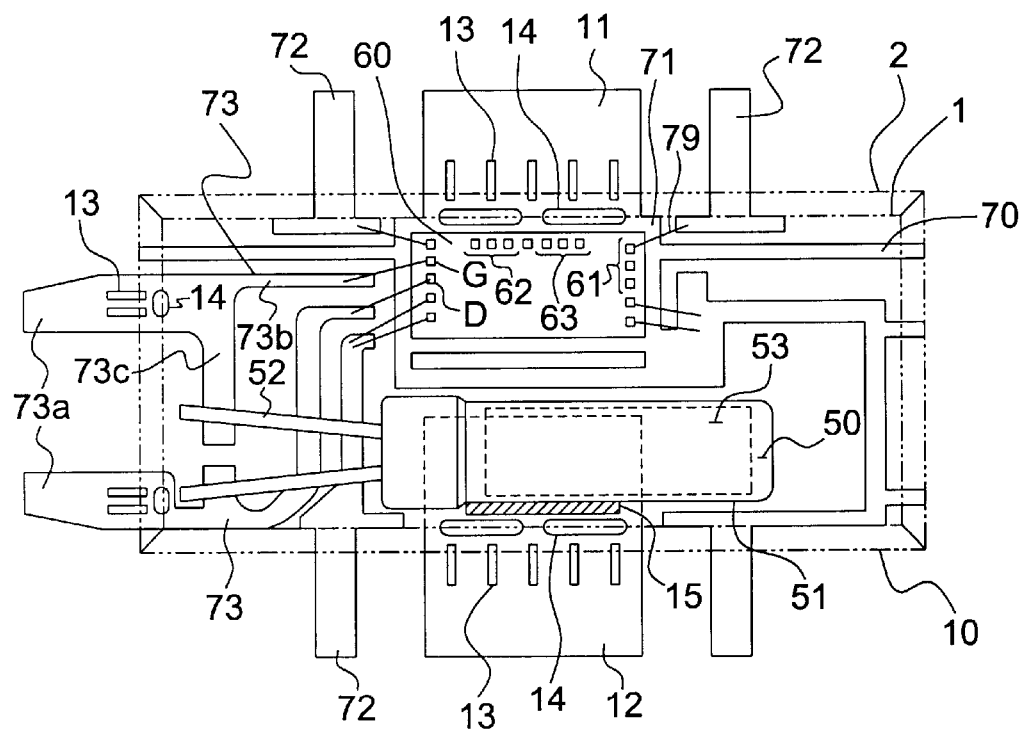
FIG. 2 is a top layout view of the piezoelectric oscillator shown in FIG. 1.

FIG. 1 shows a state of a piezoelectric oscillator 10 according to a first embodiment of the present invention when the same is viewed from an external position. FIG. 2 is a top perspective view of the configuration in the piezoelectric oscillator 10 according to this embodiment. The piezoelectric oscillator 10 according to this embodiment is a piezoelectric oscillator in which a resonator 50 having a piezoelectric element 53, such as a quartz crystal resonator or a SAW resonator, and sealed in a cylindrical case 51 and an IC chip 60 of a CMOS type or the like disposed parallel to the resonator 50. The foregoing resonator 50 and the IC chip 60 are sealed by a molding resin 1 into a substantially rectangular shape by a transfer molding method or the like so that an integrated piezoelectric oscillator 10 is formed. A plurality of leads are exposed from a side surface 2 of a plastic package of the piezoelectric oscillator 10 formed by the molding resin 1.

In the molding resin, the IC chip 60 is secured to a plate-like molded island 71 of a lead frame 70 by an electroconductive adhesive or the like. Among a plurality of electrodes 61 prepared for the chip 60, an electrode for a power supply voltage and an input/output electrode are connected to input/output leads 72 of the lead frame 70 by wire bonding lines 79. The leads 72 are so disposed that their outer leads project over two side surfaces 2 of the piezoelectric oscillator 10. FIG. 2 shows a state where the outer lead portions of the leads 72 extend from the side surfaces 2. FIG. 1 shows a state where the outer lead portions of the leads 72 are each bent into a J-shape, that is, J-leads. The foregoing leads are formed by molding a frame state, and by removing tie bars or the like connecting the leads, followed by bending the leads. A surface mounting device of an SOJ-shape package type having J-leads of the foregoing type has an advantage that the area required to mount the same can be reduced.

The resonator 50 so disposed in the molding resin 1 as to be substantially in parallel to the IC chip 60 has a substantially cylindrical case 51. The case 51 includes the piezoelectric element 53 sealed therein. The piezoelectric element 53 is a element comprising a piezoelectric material, such as a quartz crystal resonator piece or a SAW resonator piece and permitting a specific frequency in a frequency range from tens of MHz to about 100 MHz, furthermore to hundreds of MHz, to be stably obtained. Two resonator leads 52 connected to the internal piezoelectric element 53 extend from one of the ends of the case 51 to be allowed to respectively pass through connection leads 73 of the lead frame so as to be connected respectively to a gate G and a drain D of the electrodes 61 of the IC chip 60. The resonator leads 52 are secured to the corresponding connection leads 73 by resistance spot welding, soldering or an electroconductive adhesive.

The piezoelectric oscillator 10 according to this embodiment further comprises a radiating lead 11 formed continuously with the island 71 of the lead frame 70. The radiating lead 11 is a plate-like electroconductive member having a width that is substantially the same as that of the island 71. The radiating lead 11 is exposed from the side surfaces 2 of the package that are formed integrally with the island 71 and molded by a molding resin to substantially maintain the width when molded. The lead frame 70 is made of excellent electroconductive material, such as 42-Alloy of Fe—Ni (containing Ni by 42%) alloy or Cu alloy. This excellent electroconductive material also exhibits considerably high heat conductivity. Therefore, heat generated in the IC chip 60 is, conducted to the radiating lead 11, through the island 71 and radiated to the outside of the piezoelectric oscillator 10. To further improve the heat radiation effect from the radiating lead 11, it might be considered feasible to, for example, print a radiating pattern on a substrate, on which the piezoelectric oscillator 10 will be mounted. By bringing the radiating lead 11 into contact with the radiating pattern when the mounting process is performed, heat can be conducted to the radiating pattern on the substrate through the radiating lead 11 so that the heat radiation effect is further improved.

The radiating lead 11 so provided for the piezoelectric oscillator 10 according to this embodiment as to be connected to the substrate is, similarly to the leads 72, bent into a J-shape shown in FIG. 1 from a state where the same is developed as shown in FIG. 2. Although it is preferable that a wide heat-radiating lead 11 be provided in order to improve the heat radiation effect, the molding resin can be cracked or broken due to the bending load if it is wide. Therefore, the piezoelectric oscillator 10 according to this embodiment comprises the radiating lead 11 which has a plurality of holes 13 formed along the edge of the molding resin 1. Since the radiating lead 11 has a small cross section in the portion, in which the holes 13 are formed in parallel, has a small cross sectional area, the load required to bend the radiating lead 11 into the J-shape can be reduced. Therefore, the radiating lead 11 can be worked without the molding resin 1 being protected from cracks and breakages. Since air circulates through the foregoing holes 13 formed in the radiating lead 11 bent into the J-shape, the heat radiation effect of the radiating lead 11 is improved.

The radiating lead 11 further comprises elongated holes 14 extending along the inside edge of the molding resin 1. Since the radiating lead 11 is formed into a wide shape as described above, the molding resin 1 is vertically divided by the radiating lead 11 and, thus, separation easily takes place. Therefore, the piezoelectric oscillator 10 according to this embodiment comprises the radiating lead 11 that has the hole 14 through which the molding resin 1 is introduced so that vertical separation is prevented. In particular, separation occurring along the side surface 2 of the molding resin 1 is prevented by the elongated holes 14 formed along the edge of the radiating lead 11 according to this embodiment. Thus, the radiating lead 11 is further integrated along the side surface so that the separation of the molding resin 1 is prevented. In this embodiment, the elongated hole 14 formed along the edge of the molding resin 1 is divided into two sections so that a cross sectional area required to serve as the radiating lead 11 is maintained. Also heat conduction from the island 71 can be performed satisfactorily.

Furthermore, the piezoelectric oscillator 10 according to this embodiment comprises the case 51 of the resonator 50, to which a radiating lead 12 is attached. One of the ends of the radiating lead 12 extends to outside of the molding resin 1. The radiating lead 12 attached to the resonator 50 is made of an electroconductive plate-like member having substantially the same width as that of the radiating lead 11 that is connected to the island 71. To protect the molding resin 1 from being cracked, broken and separated, the radiating lead 12 has a plurality of holes 13 at the same positions as those in the radiating lead 11 and elongated holes 14 formed along the edge. The radiating lead 12 is so disposed as to be in contact with the outer surface of the cylindrical case 51. In the piezoelectric oscillator 10 according to this embodiment, an adhesive or solder 15 containing a metal filler and exhibiting excellent heat conductivity is placed between the case 51 and the radiating lead 12 so that heat is conducted satisfactorily from the case 51 to the radiating lead 12.

Since heat in the case 51 or near the case 51 can satisfactorily be discharged outwards by bringing the radiating lead 12 into contact with the case 51 or by disposing the same near the case 51, a rise in the temperature of the case 51 can be minimized. If the case 51 and the radiating lead 12 are connected to each other by the solder or the adhesive 15 as performed in this embodiment, the case 51 and the radiating lead 12 are in contact with each other along a line or a plane in place of a point. Therefore, the heat conducted to the case 51 can efficiently be conducted to the radiating lead 12 so as to be radiated. To further improve the heat radiation efficiency of the radiating lead 12, a radiating pattern may be provided to the substrate on which mounting is performed and the pattern and the radiating lead 12 may be connected to each other, similarly to the radiating lead 11 connected to the island 71. If the pattern is connected to the grounded portion, the case 51 can be grounded through the radiating lead 12 so that a shielding effect is also obtained. Since the case 51 is secured to the radiating lead 12 by the solder or the adhesive 15, the position of the oscillator can be accurately fixed when sealing with the molding resin is performed by the transfer molding method.

The piezoelectric oscillator 10 according to this embodiment is intended to have a further improved heat radiation effect by widening ends 73a of the connection leads 73 to which the resonator leads 52 are connected and to extend the ends 73a to the outside of the molding resin 1, thereby exposing the ends 73a on the outside. The ends 73a of the connection leads 73 are, as shown in FIG. 1, bent into a gull-wing shape so that the ends 73a are brought into contact with the substrate and the heat radiation effect is improved after mounting has been completed. To protect the molding resin from being damaged when the connection leads 73 are bent, holes 13 and elongated holes 14 may be formed similarly to those of the foregoing radiating leads, if necessary.

The resonator lead 52 of the oscillator 50 is, secured to an end 73c of the connection lead 73 by welding or soldering. The connection leads 73 are, also connected to the connection electrodes of the IC chip 60 by wire bonding lines. As a result, a passage is created through which heat is conducted from the IC chip 60 to the resonator 50 through the connection leads 73. In the piezoelectric oscillator 10 according to this embodiment, a portion 73b of the connection lead 73 that is connected to the IC chip 60 is narrowed so as to reduce the heat which is conducted from the IC chip 60 through the connection lead 73. Furthermore, radiating ends 73a extending out of the molding resin 1 are provided between ends 73c of the connection leads connected to the oscillator leads 52 and ends 73b connected to the IC chip 60 to enable heat conducted from the IC chip 60 to be discharged. The width of the lead between the heat discharging end 73a and the end 73c connected to the resonator lead 52 is relatively widened to enable heat conducted to the resonator 50 through the oscillator lead 52 to easily be discharged. Furthermore, the distance from the end 73b connected to the IC chip 60 to the radiating end 73a is made longer than the distance from the end 73c connected to the resonator lead 52 to the radiating end 73a so that the conducted heat is further reduced.

As described above, the piezoelectric oscillator 10 according to this embodiment comprises the radiating lead 11 connected to the island 71 to which the IC chip 60 is attached; and the radiating lead 12 connected to the case 51 of the resonator 50. Furthermore, the connection leads 73 establishing the connection between the IC chip 60 and the resonator 50 are provided with the radiating ends 73a. Since the IC chip 60 and the resonator 50 are disposed in parallel to each other, the radiating lead 11 connected to the IC chip 60 and exposed at the position opposing the resonator 50 and the radiating lead 12 connected to the resonator 50 and exposed at the position opposing the IC chip 60 minimize the influence of heat from the IC chip 60. Therefore, heat generated in the IC chip 60 can be efficiently radiated to the outside of the molding resin from the radiating lead 11 through the island 71. Also heat conducted from the IC chip 60 to the resonator 50 is radiated through the radiating lead 12 connected to the case 51. In addition, heat conducted to the resonator 50 through the connection leads 73 is reduced.

As described above, the piezoelectric oscillator 10 according to this embodiment is able to efficiently radiate heat conducted from the heat generation source, and also able to efficiently discharge heat accumulated in the package through the case 51 and the like. Therefore, the piezoelectric oscillator 10 according to this embodiment has the foregoing structure so that the heat resistance value of the package is considerably reduced. The heat resistance is a scale indicating the heat generating characteristic or the radiating characteristic of the package, heat resistance R being obtained from the following equation:

$$R = (T_j - T_a)/P \qquad (1)$$

where $T_j$ is the temperature of a connection portion (a pn-junction portion) of the IC included in the piezoelectric oscillator, $T_a$ is the ambient temperature and P is electric power consumption.

Figure 3:
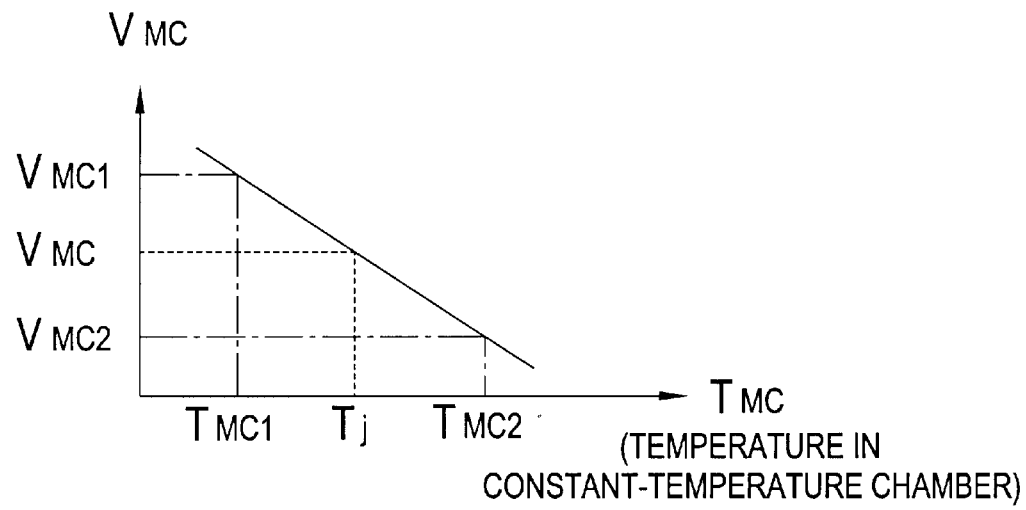
FIG. 3 is a graph for obtaining the heat resistance value of the piezoelectric oscillator shown in FIG. 1.

The temperature $T_j$ of the junction portion is proportional to voltage $V_{MC}$ in the forward direction when a predetermined measuring electric current $I_M$ is allowed to flow. Therefore, the piezoelectric oscillator 10 is placed in a constant-temperature chamber, the temperature of which is $T_{MC}$, to measure the forward-directional voltage $V_{MC}$ at two or more different points when the temperature is $T_{MC}$ so that a $V_{MC}$–$T_{MC}$ graph shown in FIG. 3 is made. Then, electric power P is applied to the piezoelectric oscillator when the ambient temperature is $T_a$. When the piezoelectric oscillator has been thermally saturated, a predetermined measuring electric current $I_M$ is allowed to flow to immediately measure $V_{MC}$. By using the forward directional voltage $V_{MC}$, the temperature $T_j$ of the junction portion is obtained by means of the corresponding temperature shown in FIG. 3. As for details, refer to MIL-STD-883C.

By the foregoing method, the heat resistance value of an oscillator was obtained, which comprised the SAW resonator, the oscillation frequency of which was 125 MHz and the maximum electric power consumption of which was about 0.3 W. The foregoing oscillator comprises a Cu frame as the lead frame thereof, the oscillator having the plastic package, the capacity of which is about 0.5 cc. The foregoing conventional piezoelectric oscillator having no lead for radiating heat has heat resistance value R of about 145° C./W. As compared with this, the piezoelectric oscillator having the radiating lead according to this embodiment has decreased heat resistance value R of about 100° C./W. Therefore, it can be understood that employment of the structure according to this embodiment is able to reduce the heat resistance value of the package to about 70% of that of the conventional structure. Simultaneously, the inventor of the present invention has performed a simulation using thermal conductivity analyzing software, thus resulting in that the piezoelectric oscillator according to this embodiment caused the temperature near the included piezoelectric device to be lowered by about 5° C. as compared with the conventional structure.

By reducing the heat resistance of the piezoelectric oscillator, heat from a semiconductor integrated circuit apparatus, such as an IC chip, mounted on the piezoelectric oscillator, can efficiently be radiated. Therefore, rise in the temperature in the minimized, and thus a smaller piezoelectric oscillator can be realized. Although an oscillator of a high-frequency oscillation type tends to increase heat generation in the semiconductor integrated circuit apparatus, a rise in the temperature of the semiconductor integrated circuit apparatus can be prevented so that damage and deterioration in the electrodes and the semiconductor integrated circuit apparatus are prevented. Furthermore, the operation reliability of the semiconductor integrated circuit apparatus can be maintained. Since influence of heat on the oscillator accommodated in the piezoelectric oscillator can also be minimized, an abnormal change in the frequency of the oscillator can be prevented. Furthermore, reliability for a long time can be maintained. Since the foregoing piezoelectric oscillator is able to maintain excellent reliability even if the heat load of the IC chip has been raised as described above, it can be used as a preferred piezoelectric oscillator of a high frequency type using a SAW resonator that has been progressed in recent years. Thus, a piezoelectric oscillator, which has a low heat resistance and excellent reliability and which is adaptable to high frequency, can be provided.

In the piezoelectric oscillator 10 according to this embodiment, the wire bonding lines are used to further efficiently radiate the heat of the IC chip 60. The wire bonding lines for establishing the connections among the electrodes of the IC chip 60 and the leads are made of electroconductive material, and therefore excellent heat conductivity can be obtained. By connecting the electrodes and the island 71 or the radiating lead 11 to one another, heat radiation can be caused from the surface on which the electrodes 61 of the IC chip 60 are disposed. To promote heat radiation, it is preferable that the number of the wire bonding lines be increased. Accordingly, the piezoelectric oscillator 10 according to this embodiment includes dummy electrodes 62 provided for the IC chip 60, wherein the foregoing electrodes 62 and the island 71 are connected to one another by the wire bonding lines 79 so that heat radiation is promoted.

Furthermore, in the piezoelectric oscillator 10 according to this embodiment, control of the oscillation frequency of the IC chip 60 is performed by connecting the controlling electrodes 63 and the grounded island 71 to one another. The IC chip 60 is so structured that the number of the electrodes 63 to be connected to the island 71 is increased as the oscillation frequency is raised. Thus, the heat radiation is prompted in the high frequency range where the heat generation is increased. As the IC chip 60 having the foregoing structure, an IC for PLL, for example, as shown in FIG. 4 is available.

Figure 4:
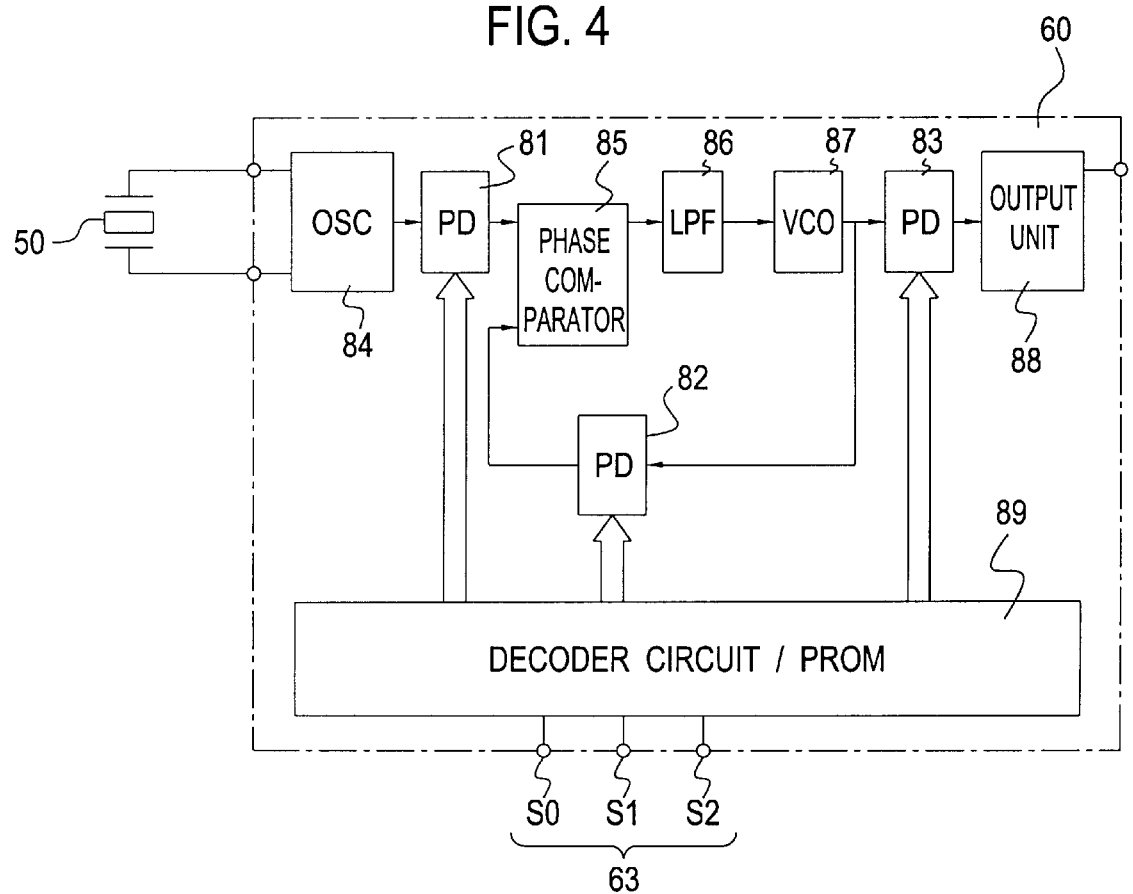
FIG. 4 is a block diagram showing the structure of an IC for PLL for use in the piezoelectric oscillator shown in FIG. 1.

The IC 60 for PLL shown in FIG. 4 comprises three programmable dividers (PD) 81, 82 and 83 capable of supplying clock signals having a predetermined frequency. A signal from an oscillation portion 84 connected to the resonator 50 and arranged to supply a reference clock signal is received by the first PD 81. Then, a signal divided by the first PD 81 is received by a phase comparator 85. The phase comparator 85 compares the signal supplied from the first PD 81 and a signal obtained by dividing an output from a voltage control oscillation circuit (VCO) 87 by a second PD 82. The high frequency components of an output from the phase comparator 85 are cut by a low-pass filter 86, and then it is received by the VCO 87. An output from the VCO 87 is divided by the third PD 83, followed by being transmitted from the IC 60 by an output portion 88. The thus-constituted circuit multiplies the reference clock signal supplied from the oscillation portion 84 so that it transmits a clock signal having a predetermined frequency. The division ratios of the three PDs 81, 82 and 83 are controlled by a decoder 89. The decoder 89 comprises a PROM that stores the division ratios of the respective PDs so that a clock signal of a desired frequency is transmitted from output unit 88 as controlled by a control terminal 63 consisting of three control terminals S0 to S2, the state of each of which can be changed from outside.

FIG. 5 is a table showing the states of the control terminals S0 to S2 and frequencies to be transmitted from the IC 60 for PLL. As can be understood from the foregoing table, setting is so made that, when the levels of all control terminals S0 to S2 are high level "1", that is, when all control terminals S0 to S2 are opened, the output frequency is made to be the lowest. Setting is so made that, when the levels of all control terminals S0 to S2 are low level "0", that is, when all control terminals S0 to S2 are grounded, the frequency is made to be the highest. Therefore, in the IC 60 for PLL according to this embodiment, when it is operated with the highest frequency, a state is realized where all control terminals 63 are connected to the island 71 by the wire bonding lines 79, as shown in FIG. 2. Therefore, in a state where the heating value of the IC 60 for PLL of a high frequency range has been increased, the number of the wire bonding lines 79 for establishing the connection between the IC chip 60 and the island 71 is increased so that the heat radiation from the IC chip 60 is promoted. As a matter of course, the IC chip 60 may be an IC for a real time clock for measuring time as well as having the foregoing PLL function for generating the clock signal. The IC chip 60 may be a semiconductor integrated circuit apparatus composed of a CMOS type oscillation circuit or the like and having no PLL circuit.

Figure 6:
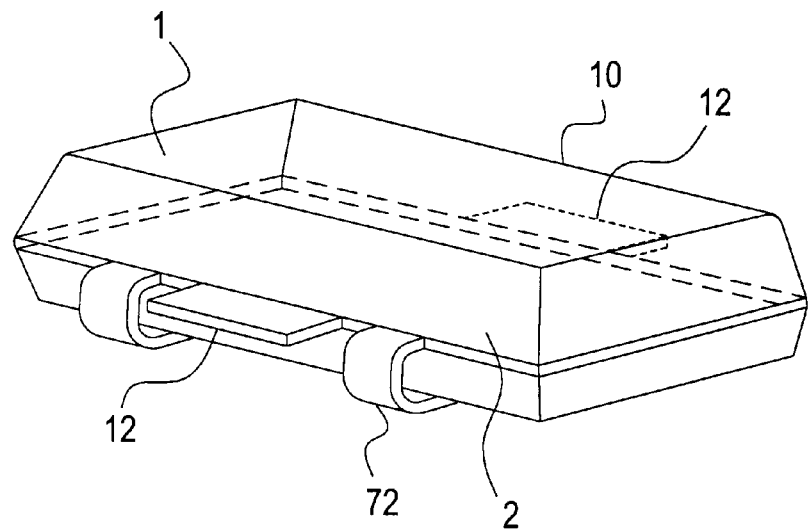
FIG. 6 is a perspective view of a piezoelectric oscillator according to a second embodiment of the present invention.
Figure 7:
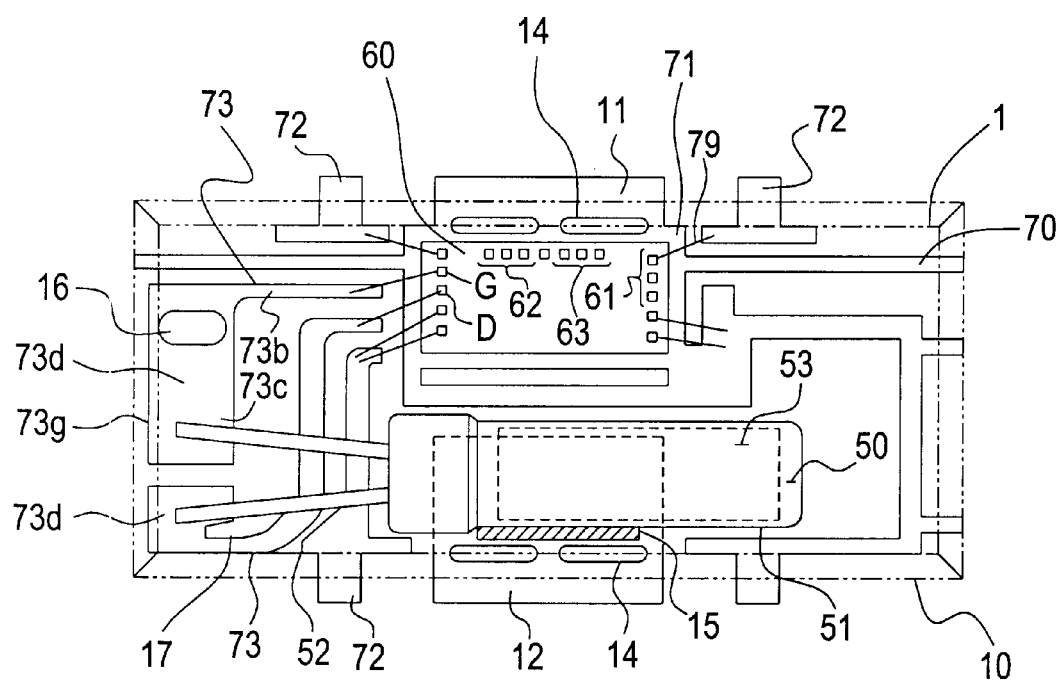
FIG. 7 is a top layout view of the piezoelectric oscillator shown in FIG. 6.

FIG. 6 shows a piezoelectric oscillator 10 according to a second embodiment of the present invention when viewed from an outside position. FIG. 7 shows the configuration of internal elements in the piezoelectric oscillator 10 according to this embodiment when viewed from an upper position. As can be understood from the foregoing figures, the piezoelectric oscillator 10 according to this embodiment is an oscillator comprising an resonator 50 and an IC chip 60 that are disposed in parallel to each other and formed by molding with molding resin, similarly to that according to the foregoing embodiment. Common elements to those of the foregoing embodiment are given the same reference numerals and they are omitted from description.

The piezoelectric oscillator 10 according to this embodiment comprises radiating leads 11 and 12 each having an unbent portion which is exposed to the outside. If the radiating leads 11 and 12 are developed as employed in this embodiment, a satisfactory heat radiation effect can be obtained. Therefore, the piezoelectric oscillator 10 according to this embodiment also enables effects to be obtained in that heat generated in the IC chip 60 can be efficiently discharged, a rise in the temperature in the molding resin can be minimized, and a rise in the temperature of the resonator 50 can be moderated. Similarly to the foregoing embodiment, a plurality of parallel holes may be opened in the radiating leads 11 and 12 to improve the heat radiation effect due to air circulation.

In the piezoelectric oscillator 10 according to this embodiment, the connection leads 73 connected to the resonator leads 52 are not exposed to the outside of the molding resin 1 except cut portions 73g. Depending upon the environment where the piezoelectric oscillator 10 is mounted and upon the characteristics of the IC chip 60, the connection leads 73 exposed to the outside of the molding resin 1 sometimes raises an influence of humidity, such as interruption of oscillations of the IC chip 60. Accordingly, in the piezoelectric oscillator 10 according to this embodiment, the connection leads 73 connected to the resonator leads 52 are not exposed to the outside except the cut portions 73g to maintain insulation between the gate G and the drain D even if the ambient humidity has been changed so that oscillation with stable frequencies is enabled. In place of exposing the connection leads on the outside of the molding resin, wide radiating regions 73d are formed adjacent to the surface and along the edge of the molding resin 1 so that heat is radiated through the molding resin 1 that thinly covers the radiating regions. The thickness of the portion of the package including the foregoing radiating regions 73d can be made thinner than that of the portion of the package including the resonator. Since the radiating region 73d is formed between an end 73b connected to the IC chip 60 and an end 73c connected to the resonator lead 52, heat from the IC chip 60 can be radiated in the radiating region 73d so that influence on the resonator 50 is reduced.

To minimize the influence of the heat from the IC chip 60, a circular region 16 formed by cutting the lead 73 between the end 73b connected to the electrode of the IC chip 60 and the radiating region 73d; and a narrow region 17 are provided. Since the regions 16 and 17 formed by cutting the leads have small cross sectional areas, heat to be conducted can be reduced. Therefore, influence of the generation of heat in the IC chip 60 upon the resonator 50 can be further minimized.

Figure 8:
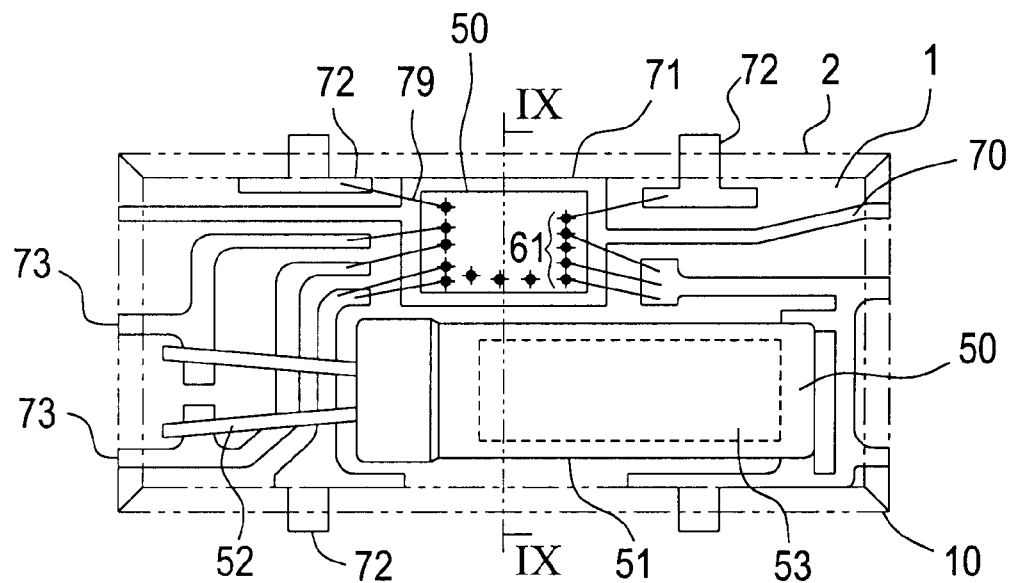
FIG. 8 is a top layout view of a piezoelectric oscillator according to a third embodiment of the present invention.
Figure 9:
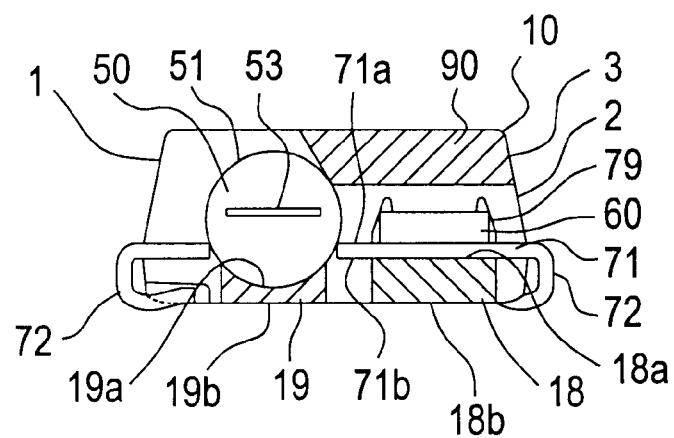
FIG. 9 is a cross-sectional view taken along line IX of the piezoelectric oscillator shown in FIG. 8.

FIG. 8 shows the internal structure of a piezoelectric oscillator according to the present invention when viewed from an upper position, and FIG. 9 shows the cross sectional structure of the same. Also the piezoelectric oscillator 10 according to this embodiment is a piezoelectric oscillator in which a resonator 50, that has a cylindrical case 51, and an IC chip 60 are disposed in parallel to each other and which is sealed into a substantially rectangular shape by molding resin 1. Common elements to those of the foregoing embodiments are given the same reference numerals and they are omitted from description.

One of the surfaces of an island 71 of a lead frame 70 of the piezoelectric oscillator according to this embodiment, that is, an upper surface 71a shown in FIG. 9 has an IC chip 60 mounted thereon by electroconductive adhesive or the like. Electrodes provided for the surface of the IC chip 60 are connected by wire bonding lines 79 to predetermined leads of the island and the like. The lead frame 70 according to this embodiment has a radiating plate 18 connected to a surface 71b thereof that opposes another surface 71a of the island 71 on which the IC chip 60 is mounted. The radiating plate 18 consists of one or more members made of material exhibiting excellent heat conductivity, such as Cu alloy and has an end or a surface 18a which is in contact with the surface 71b of the island. Another end or a surface 18b is exposed to the outside of the molding resin 1. Although the radiating plate 18 may be attached to the island 71 by soldering or adhesive exhibiting excellent heat conductivity, the surface 18a of the radiating plate, which is in contact with the island 71, is finished into a flat surface that is substantially the same as the surface 71b of the island; and the radiating plate 18 is brought into close contact with the island 71 when transfer molding is performed so that excellent heat conductivity is obtained. By attaching the radiating plate 18 to island 71, a portion exposed to the outside of the molding resin 1 is formed from the island 71. Thus, heat generated in the IC chip 60 can efficiently be radiated similarly to the foregoing embodiments.

The resonator 50 according to this embodiment that is disposed substantially in parallel to the IC chip 60 has a cylindrical case 51. The case 51 accommodates a rectangular piezoelectric element 53 made of an AT cut quartz crystal piece or the like. In the piezoelectric oscillator 10 according to this embodiment, a radiating plate 19 is so attached to the lower surface of the case 51 as to be substantially in parallel to the foregoing radiating plate 18. The radiating plate 19 consists of one or more members made of material exhibiting excellent heat conductivity, similarly to the radiating plate 18, and has a surface 19a so curved as to be brought into close contact with the cylindrical case 51. Another surface 19b is exposed to the outside of the molding resin 1. The radiating plate 19 forms a radiating portion that is exposed to the outside of the molding resin 1 from the case 51. Therefore, heat conducted to the case 51 is, similarly to the foregoing embodiments, efficiently radiated to the outside through the radiating plate 19. Thus, influence of heat upon the piezoelectric element 53 sealed in the case 51 can be minimized.

In the piezoelectric oscillator 10 according to this embodiment, a heat sink 90 is attached in a space above the IC chip 60. That is, the thickness of the case 51 of the resonator is required to be at least about 2 mm at present. Additionally, the thickness of the IC chip 60 is about 1 mm or less, for example, about 0.4 mm. Therefore, a space, is formed in which the molding resin is thick even in a state where the IC chip 60 has been mounted on the island 71. Therefore, in the piezoelectric oscillator 10 according to this embodiment, the heat sink 90 is attached in the foregoing space so that heat in the molding resin 1, particularly heat upwards conducted from the IC chip 60 is discharged to the outside. As can be understood from FIG. 9, the heat sink 90 is extended from the side surface 2 of the package molded by the molding resin 1 to a position near the case 51 of the resonator so that heat radiation from the case 51 is enabled simultaneously.

Figure 10:
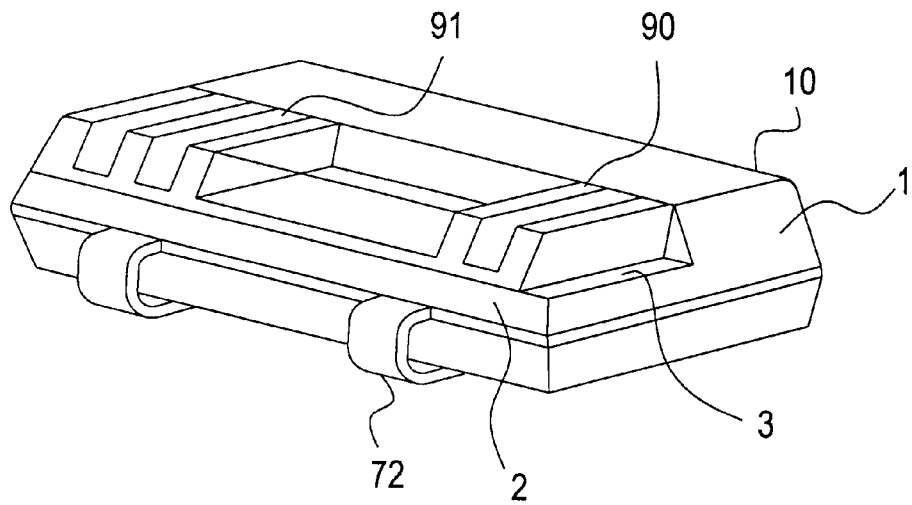
FIG. 10 is a perspective view of the piezoelectric oscillator shown in FIG. 8.

FIG. 10 shows the shape of the piezoelectric oscillator 10 according to this embodiment having the heat sink 90 attached thereto. In this embodiment, a die having a convex space above the IC chip 60 is used when transfer molding is performed so that a concavity 3 is formed in the outer surface of the piezoelectric oscillator 10 that is molded into a substantially rectangular shape with the molding resin 1. Furthermore, the heat sink 90 having a wide radiating surface 91 made of metal, such as aluminum, is secured to the convex portion 3 with adhesive or the like exhibiting excellent heat conductivity. As described above, in the piezoelectric oscillator 10 according to this embodiment, the heat sink 90 is mounted in the space above the IC chip 60, which has been, in the conventional structure, filled with molding resin, so that the heat radiation effect is improved. Therefore, attaching of the heat sink 90 does not result in the enlargement of the piezoelectric oscillator 10. Thus, a small and thin piezoelectric oscillator exhibiting excellent heat radiation effect can be realized. Since the space, which has been filled with the molding resin in the conventional structure, can be omitted from the structure, a portion, in which heat is accumulated, can be reduced.

Figure 11:
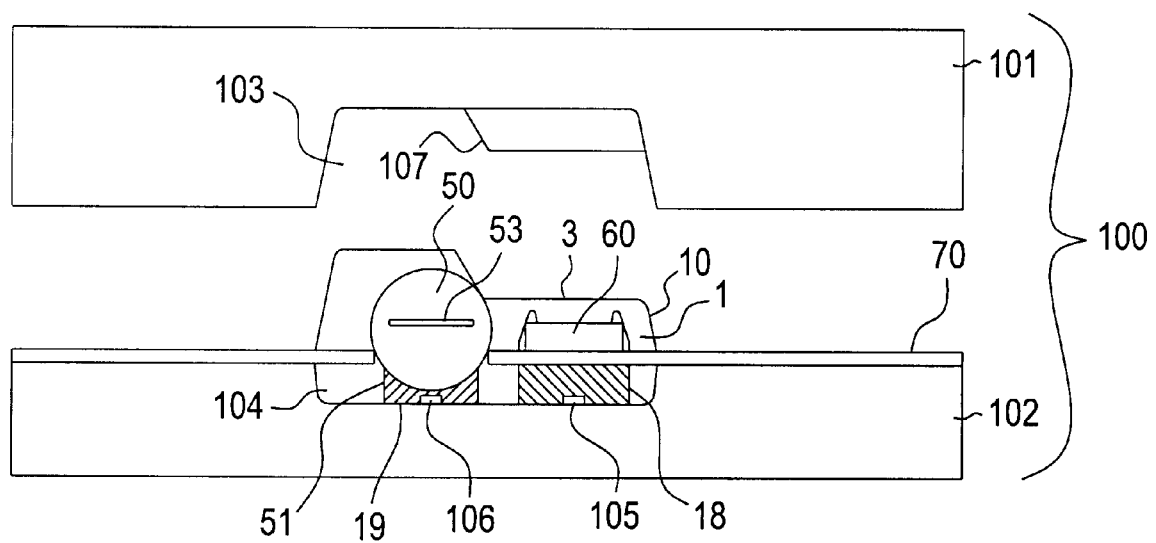
FIG. 11 is a diagram showing a state where the piezoelectric oscillator shown in FIG. 8 is molded.

FIG. 11 shows a state where the piezoelectric oscillator according to this embodiment is molded by using a transfer molding die 100. The transfer molding die consists of an upper die 101 and a lower die 102, each of which has a concavities 103 and 104 for packaging the piezoelectric oscillator 10. The concavity 104 of the lower die 102 has pins 105 and 106 for securing the radiating plates 18 and 19 to predetermined positions. By providing the pins 105 and 106, locating of the radiating plates can easily be performed, and undesirable shift and inclination of the radiating plates by the pressure of the resin injected at the time of performing molding can be prevented. Since the radiating plates must be secured by the molding resin to maintain thermal contact with the island 71 or the case 51 in this embodiment, it is preferable that locating of the radiating plates can be performed accurately as can be realized with the transfer molding die according to this embodiment. As a matter of course, a concavity and a convexity may be provided for the transfer molding die in place of the pins in order to accurately maintain the position of the radiating plates.

The concavity 103 of the upper die 101 has convexity 107 for forming the concavity 3 for disposing a heat sink. The lead frame 70, on which the resonator 50 and the IC chip 60 are mounted, and the radiating plates 18 and 19 are placed in the transfer molding die 100 having the foregoing structure. Then, resin molding into the body of the plastic package is performed in a state where the outer portion of the lead frame is left. After molding has been performed, tie bars and the like for connecting the inner leads of the lead frame and the like are removed by cutting, and the outer lead portions projecting over the plastic package are subjected to a bending work. Then, the foregoing heat sink 90 is secured by bonding or the like so that an oscillator in the form of an SOJ package shape is obtained.

The piezoelectric oscillator according to this embodiment comprises the radiating plate 18 for mainly radiating heat generated in the IC chip 60; a radiating plate 19 for mainly radiating heat conducted from the case 51 of the resonator; and the heat sink 90 for mainly radiating heat accumulated from the top surface of the IC chip into the package made of the molding resin, thereby positively discharging heat generated in the piezoelectric oscillator. A fact was confirmed from experiments and the like that the piezoelectric oscillator according to this embodiment comprising the foregoing radiating plates and the heat sink enabled the heat resistance value to be reduced to about 50% to 70% as compared with the conventional structure as described in the first embodiment. Therefore, also the temperature at the junction of the IC chip can be lowered so that excellent reliability of the chip is realized. Also change in the frequency of the oscillator can be prevented, and the reliability for a long time can be maintained.

Heat radiated from means, such as the radiating plates and the heat sink, can be arbitrarily adjusted in dependence upon the size, material and the like, similarly to heat radiated from the radiating leads according to the foregoing embodiments. Therefore, the control of heat from the IC chip and the resonator can be individually and specifically performed. As a result, a piezoelectric oscillator can be provided, which has been designed under an appropriate heat control in consideration of the influences of the heating value of each device or change in the external temperature. As a matter of course, a heat sink may be attached in place of the radiating plates, and also the reverse can be employed. The number of the radiating plates is not limited to the number that corresponds to the IC chip and the resonator. Each device may be provided with a plurality of radiating plates to adjust the heat to be discharged depending upon the place or the like. As a matter of course, a radiating plate common to the IC chip and the resonator may be provided.

Figure 12:
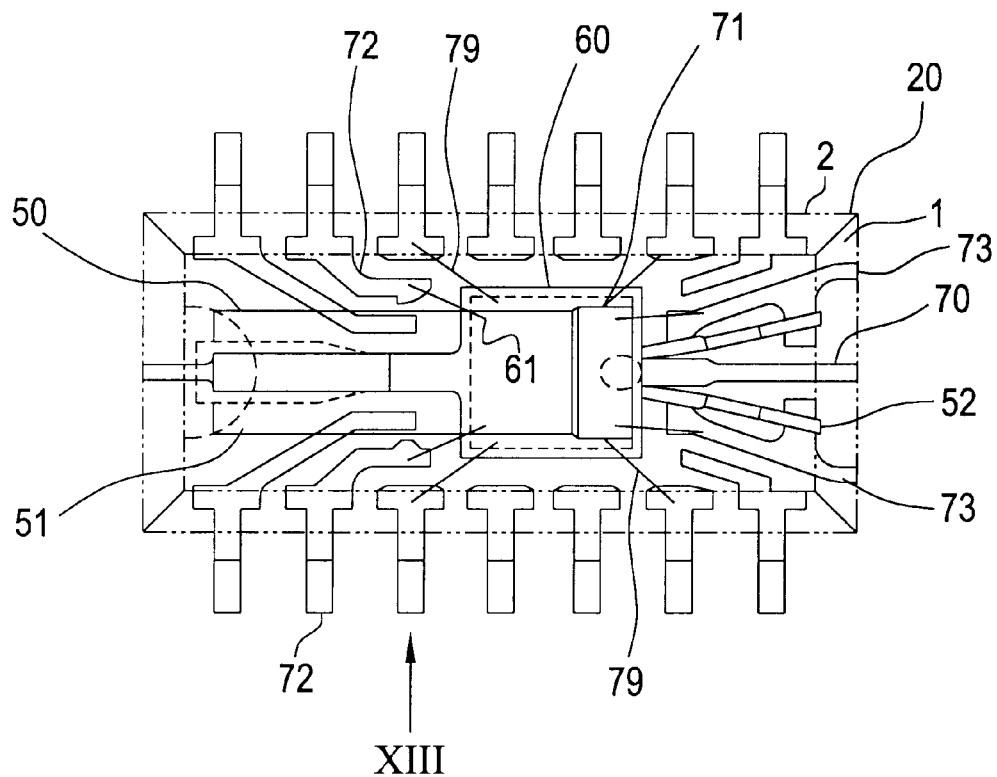
FIG. 12 is a top layout view of a piezoelectric oscillator according to a fourth embodiment of the present invention.
Figure 13:
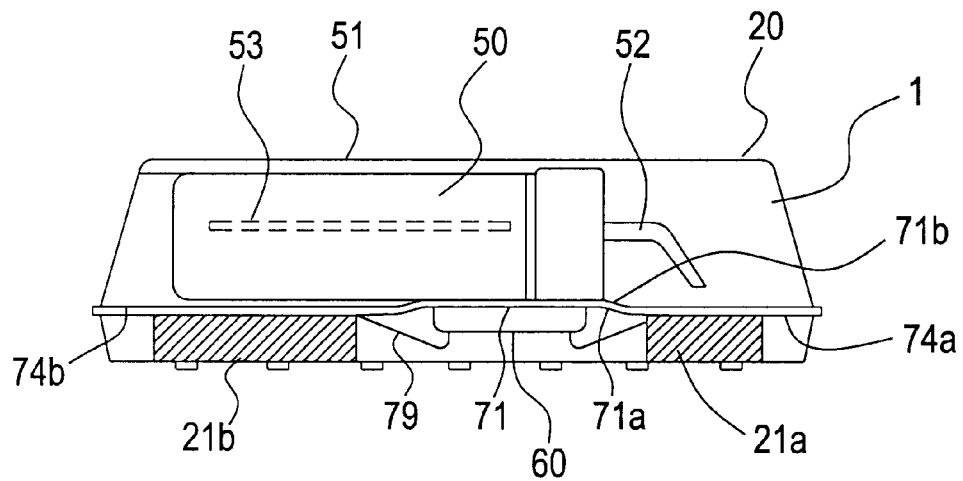
FIG. 13 is a side view of the piezoelectric oscillator shown in FIG. 12.

FIG. 12 shows the internal configuration of elements in a piezoelectric oscillator 20 according to a fourth embodiment of the present invention. FIG. 13 is a side view of the same. The piezoelectric oscillator 20 according to this embodiment is a piezoelectric oscillator in which an IC chip 60, a lead frame 70 and a resonator 50 are, in this sequential order, stacked from a lower position when viewed in FIG. 13 and which is sealed with molding resin 1 into a substantially rectangular shape. Also in the foregoing piezoelectric oscillator 20, the IC chip 60 is secured to an island 71 by electroconductive adhesive or the like. Electrodes 61 of the chip 60 and each lead are connected to one another by wire bonding lines 79 similarly to the foregoing piezoelectric oscillator 10. Accordingly, common elements to those of the foregoing embodiments are given the same reference numerals and they are omitted from description.

In the piezoelectric oscillator 20 according to this embodiment, a case 51 of the resonator is mounted on a surface 71b of the island 71 that opposes a surface 71a, on which the IC chip 60 is mounted. Two radiating plates 21a and 21b are connected to a surface 71a of suspension pin portions 74a and 74b of the lead frame connected to the two sides of the island 71, the IC chip being mounted on the surface 71a. Therefore, heat generated in the IC chip 60 can efficiently be radiated through the island 71 so that rise in the temperature of the IC chip 60 is minimized. Also heat to be conducted to the portion including the resonator 50 can be reduced so that influence of heat on the resonator 50 can be eliminated satisfactorily.

Since the piezoelectric oscillator 20 according to this embodiment is a type in which the IC chip 60 and the resonator 50 are stacked, the area required when they are mounted on a substrate can be reduced. However, the overall thickness of the oscillator is increased, and thus a satisfactorily long distance cannot be maintained from the IC chip 60 to the resonator 50. As a result, the oscillator is in a state where it can relatively easily be affected by the heat. Accordingly, in the piezoelectric oscillator 20 according to this embodiment, the radiating plates 21a and 21b are provided for the suspension pin portions 74a and 74b as described above so that heat from the IC chip 60 is positively radiated and the influence of heat upon the resonator 50 is minimized without an increase in the thickness of the package. The IC chip 60 and the resonator 50 may, of course, be disposed in a sequential order contrary to that shown in FIG. 13. However, by exposing the radiating plates from the suspension pin portions 74a and 74b onto the surface that is in contact with the substrate as is employed in this embodiment so that provision of a radiating pattern for the substrate further enhances the heat radiation effect. As a matter of course, the number and the positions of the radiating plates are not limited to those employed in this embodiment.

Figure 14:
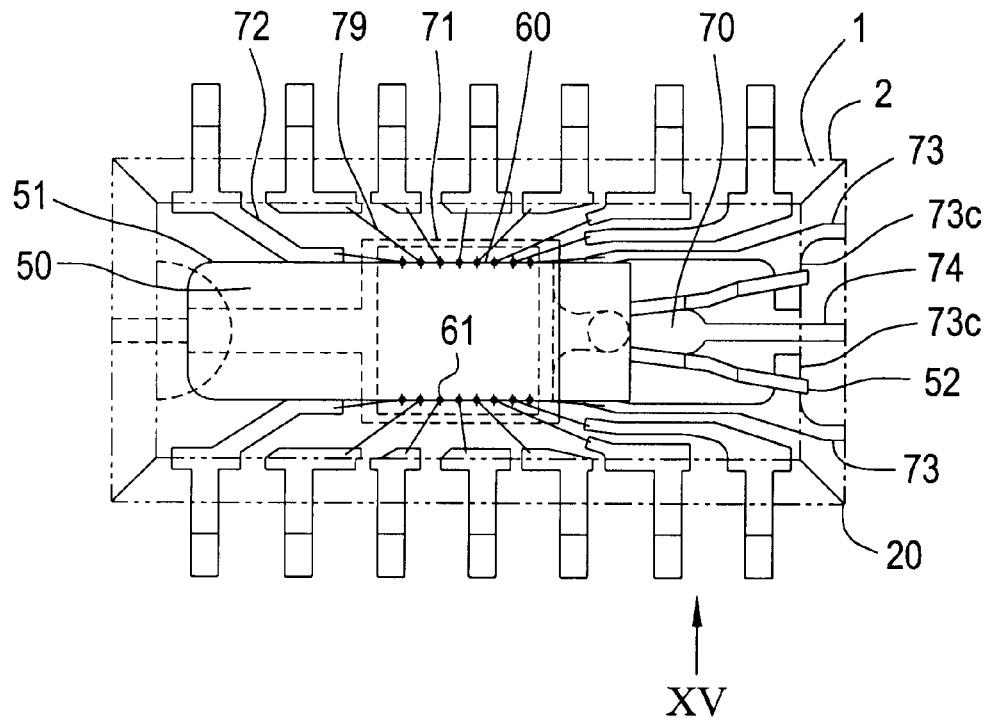
FIG. 14 is a top a piezoelectric oscillator according to a fifth embodiment of the present invention.
Figure 15:
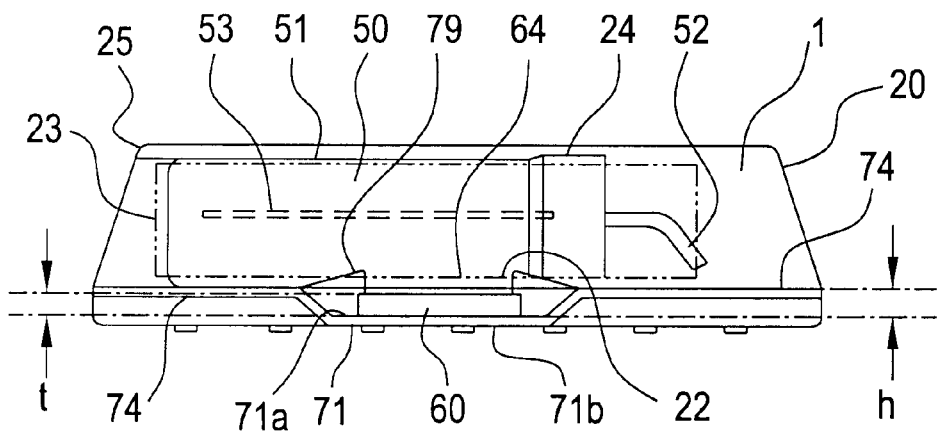
FIG. 15 is a side view of the piezoelectric oscillator of FIG. 14.

FIG. 14 shows the internal configuration of elements in a piezoelectric oscillator 20 according to a fifth embodiment of the present invention when viewed from an upper position. FIG. 15 is a side view of the same. In the piezoelectric oscillator 20 according to this embodiment, a lead frame 70, an IC chip 60 and a resonator 50 are, in this sequential order, stacked and they are sealed with molding resin. Note that common portions of the structure and the like of the resonator 50 and the IC chip 60 are given the same reference numerals and they are omitted from description.

The lead frame 70 according to this embodiment is so press-worked as to position a plate-like island 71, on which the IC chip 60 will be mounted, at a position vertically shifted from suspension pin portions 74 on the two sides of the island 71 when viewed in FIG. 15. The depression quantity h is determined to be larger than thickness t of the IC chip 60 such that the depression quantity h is about 0.5 mm when the thickness t of the IC chip 60 is about 0.4 mm for example. By determining the dimensions as described above, a cylindrical case 51 of the resonator 50 is so disposed as to be in contact with the suspension pin portion 74 of the lead frame 70, thereby a gap 22 is created from the surface of the case 51 and that of the IC chip 60 by about 0.1 mm to 0.15 mm. If the gap 22 having about the foregoing size is provided, a short circuit between the resonator 50 and the IC chip 60 can be prevented. Furthermore, since the molding resin flows through the foregoing gap 22 when charging is performed so that charging characteristic is improved.

In the piezoelectric oscillator 20 according to this embodiment, the lead frame 70, the IC chip 60 and the resonator 50 are stacked in this sequential order so that some merits are attained. First, a reverse surface 71b of the island 71 of the lead frame 70 can be exposed to the outside of molding resin 1. In place of disposing the lead frame 70 between the IC chip 60 and the resonator 50, the same is disposed on the side opposing the resonator 50 with respect to the IC chip 60. Thus, a portion of the same can be exposed to the outside of the molding resin 1. That is, in place of respectively disposing the IC chip 60 and the resonator 50 on the two sides of the lead frame 70, the IC chip 60 and the resonator 50 are disposed on either side of the lead frame 70. Thus, the other side of the lead frame 70 can be exposed to the outside of the molding resin 1. Since the island 71 is, in this embodiment, depressed in a direction opposing the direction in which the resonator 50 and the IC chip 60 are disposed, the reverse surface 71b opposing the surface 71a, on which the IC chip is mounted, is exposed. Since the IC chip 60 is, by electroconductive adhesive or the like, secured to the surface 71a of the island 71, exposing of the reverse surface 71b enables heat generated in the IC chip 60 to be efficiently radiated. Since the reverse surface 71b of the island is, in the piezoelectric oscillator 20 according to this embodiment, exposed on the side which is in contact with the substrate, the heat radiation effect can be promoted by using the substrate in such a manner that, for example, a radiating pattern is formed on the substrate. As described above, the piezoelectric oscillator according to this embodiment enables the small-size piezoelectric oscillator 20 which exhibits excellent heat radiation effect and in which a rise in the temperature can be minimized to be realized.

Furthermore, in the piezoelectric oscillator 20 according to this embodiment, the resonator 50 is disposed in a space 23 above a surface 64 of the surfaces of the IC chip 60 on which the electrodes 61 are disposed. Therefore, the space 23, in which the electrodes and the leads are wire-bonded, can be also used as a space for disposing the resonator 50 so that the overall thickness of the piezoelectric oscillator is reduced. The piezoelectric oscillator 20 of a type, in which the IC chip 60 and the resonator 50 are stacked, enables the area required to mount the same to be reduced. However, a sufficiently high space has been required above the substrate. On the contrary, the piezoelectric oscillator 20 according to this embodiment enables the piezoelectric oscillator 20 to be thinned so that the clearance on the substrate is reduced. Thus, a space required for mounting can be reduced. In particular, the oscillator 50 according to this embodiment has the cylindrical case 51, and a surface 64 of the IC chip 60 has electrodes 61 disposed along the lengthwise direction of the case 51. Therefore, as the space for wiring the electrodes and the leads, the gap between the curved side surface of the case 51 and the surface of the IC chip can be used. Thus, wiring in the form of a loop having appropriate intervals can be performed into the foregoing space from the case 51. It is preferable that the interval be, for example, about 0.2 mm or longer. Thus, a compact piezoelectric oscillator can be provided with which a risk of generation of short circuit can be eliminated.

In the piezoelectric oscillator 20 according to this embodiment, the case 51 of the resonator is supported by the suspension pin portion 74 of the lead frame. Furthermore, the lead frame 70 is, from outside, supported by the reverse surface 71b of the island 71 that is exposed to the outside of the molding resin 1. Therefore, the position of the resonator 50 can accurately be located during transfer molding.

Since the resonator and the IC chip are, in the piezoelectric oscillator 20 according to this embodiment, disposed on the same side of the lead frame, the manufacturing process can be simplified and manufacturing can be performed with excellent yield attained. Furthermore, the manufacturing cost can be reduced.

Figure 16:
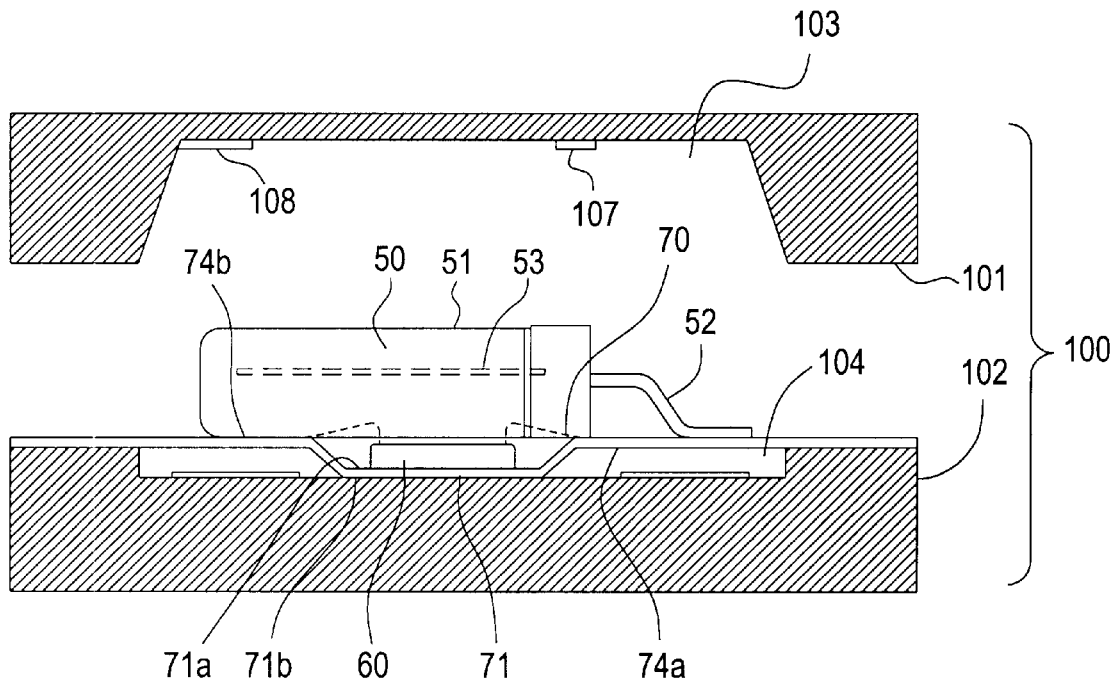
FIG. 16 is a side view of the piezoelectric oscillator of FIG. 14 before it is molded.
Figure 17:
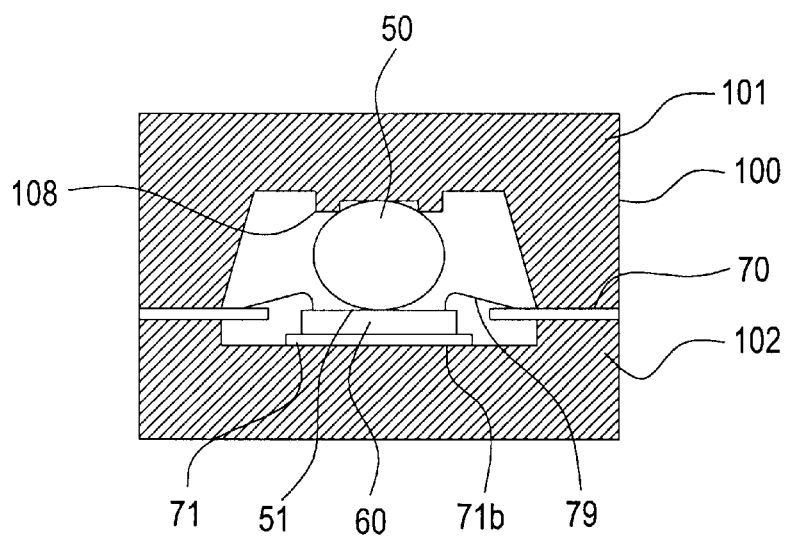
FIG. 17 is a cross-sectional view of the piezoelectric oscillator of FIG. 14 as it is molded.

FIGS. 16 and 17 show an example of a transfer molding die 100 for use when the piezoelectric oscillator 20 according to this embodiment is manufactured. The transfer molding die 100 is, similarly to the foregoing die, separated into an upper die 101 and a lower die 102, each of which has concavities 103 and 104 for determining the shape of the piezoelectric resonator 20. The case 51 of the oscillator is placed in a lower die 102 in a state where its leading end and its portion adjacent to the resonator leads are supported by the suspension pin portions 74a and 74b of the lead frame. The concavity 103 of the upper die 101 has pins 107 and 108 disposed at positions at which the same is in contact with the case 51. Therefore, setting of the upper die 101 on the lower die 102 causes the case 51 of the resonator to be brought into a state where the same is vertically held by the pins 107 and 108 and the suspension pin portions 74a and 74b. Furthermore, the suspension pin portions 74a and 74b are applied with pressure from the island 71 which is in contact with the lower die 102. As a result, the case 51 of the resonator is brought into a state where the same is held between the upper and lower dies 101 and 102 so that the same is secured to a predetermined position in the die 100. Additionally, the reverse surface 71b of the island is pressed against the lower die 102 by the upper die 101 through the case 51 of the resonator. Therefore, the reverse surface 71b of the island is brought into close contact with the surface of the die 102 so that introduction of the molding resin is prevented and the reverse surface 71b can be exposed out of the molding resin. If a hole, that can be covered by the reverse surface 71b of the island, is formed in the concavity 104 of the die 102, the surface of the die 102 and the reverse surface 71b of the island are reliably brought into contact with each other due to the action of the pressure of the molding resin. As a result, movement of the molding resin to reach the reverse surface 71b can perfectly be prevented.

The leading ends of the pins 107 and 108 provided for the die 101 may be formed into a curved shape to fit the surface of the cylindrical case 51. Thus, the horizontal positional accuracy can further be improved. As a result, the position of the resonator 50 can considerably accurately be located in the transfer molding die 100. Therefore, the molding resin for covering the resonator 50 is not required to have a thickness determined in consideration of the deviation of the position of the case, and thus the thickness can be minimized. In this embodiment, the minimum thickness of the portion above the case 51 can be made to be about 0.15 mm determined in consideration of the charging characteristic of the molding resin. Thus, a very thin molding resin film can be formed on the outside of the case 51.

As described above, in the piezoelectric oscillator 20 according to this embodiment, the molding resin covering the case 51 of the resonator is very thin so that the overall height of the piezoelectric oscillator is lowered to about 2.7 mm. Since the piezoelectric oscillator is covered with only a thin film molding resin, a heat radiation effect is satisfactory and influence from the IC chip can be reduced.

Figure 18:
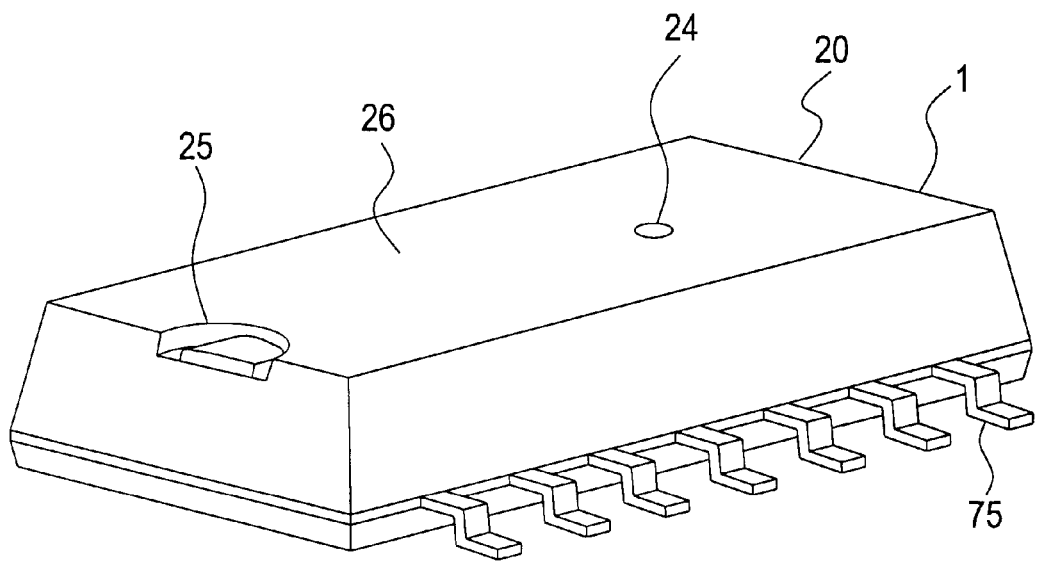
FIG. 18 is a perspective view of the piezoelectric oscillator shown in FIG. 14.

FIG. 18 shows the shape of the piezoelectric oscillator 20 according to this embodiment. A through hole 24, that reaches the surface of the case 51, and a concavity 25 appear on an upper surface 26 of the molded piezoelectric oscillator 20 according to this embodiment. The foregoing hole 24 and the concavity 25 are traces of the pins 107 and 108 provided for the molding die. The diameter of the hole 24 is about 0.6 mm. The concavity 25 is also used as a first-pin mark indicating the position of a first pin of the piezoelectric oscillator 20. A leading end 75 of the lead projecting over the side surface 2 of the piezoelectric oscillator 20 according to this embodiment is bent into a gull-wing shape so that an SOP-type 14-pin package is formed.

Figure 19:
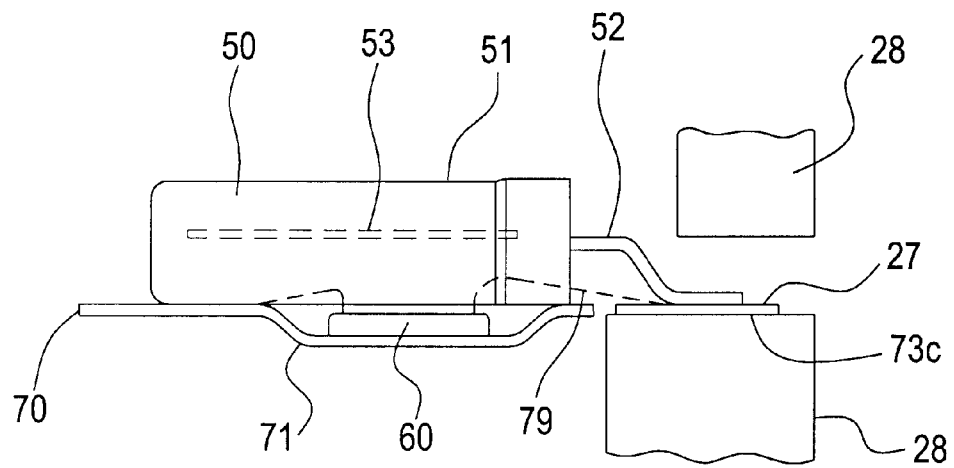
FIG. 19 is a diagram showing a state where resonator leads and connection leads of the piezoelectric oscillator shown in FIG. 14 are welded.

FIG. 19 shows a state where the resonator leads 52 of the resonator are connected to the connection leads 73 that are connected to the IC chip 60. A portion 73c of the connection lead 73, which is connected to the resonator lead 52, is applied with silver plating 27. The resonator leads 52 and the connection leads 73 are connected to one another by resistance spot welding. The resistance spot welding is performed in such a manner that high conductive electrodes 28 made of chrome copper, from upper and lower positions, hold the connection end 73c of the connection lead and the resonator lead 52 in a sandwich manner. Then, a large electric current is allowed to flow so that metal is welded. Since the end 73c of the connection lead according to this embodiment has the surface applied with the silver plating 27 having a thickness of about several μm, the density of the electric current in the boundary of welding can be stabilized. Thus, satisfactory welding can be performed without defects in welding, such as explosion so that an effect is obtained particularly in welding different metals to each other, such as a Cu-alloy lead frame forming the connection lead 73 and a steel alloy lead forming the resonator lead 52. The silver plating to be applied to the connection leads 73 may be performed simultaneously with performing silver plating of a portion (a second bonding portion), in which another lead frame is wire-bonded. That is, since the position, at which the lead frame 70 is wire-bonded, and the connection end 73c of the connection lead are on the same plane, the silver plating works can be performed in the same process. Therefore, silver plating of the connection leads 73 can be performed without enlargement of the manufacturing cost and increase in the number of manufacturing processes. Thus, the reliability of the junction points between the resonator and the leads can be improved. As a result, a high quality piezoelectric oscillator can be provided.

Figure 20:
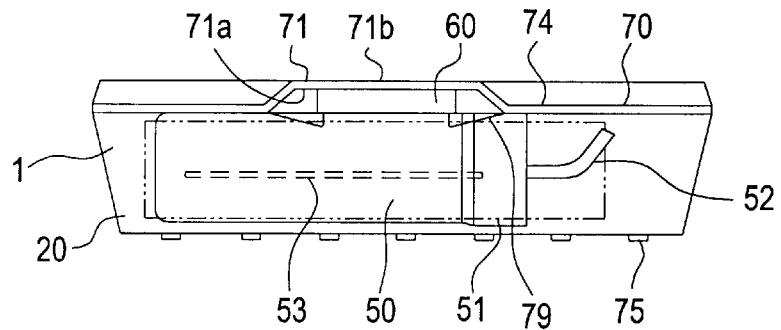
FIG. 20 is a side view of another piezoelectric oscillator according to the fifth embodiment.

FIG. 20 shows a side view of the structure of the piezoelectric oscillator 20 according to this embodiment, in which the resonator 50 is disposed on the surface that is mounted on the substrate. In the piezoelectric oscillator 20, the direction, in which the resonator leads 52 are bent, is made toward the resonator that opposes the direction of the same in the foregoing piezoelectric oscillator. Therefore, when the piezoelectric oscillator 20 has been mounted, the reverse surface 71b of the island appears on the surface of the substrate so that excellent heat radiation effect is obtained without applying heat to the substrate.

Figure 21:
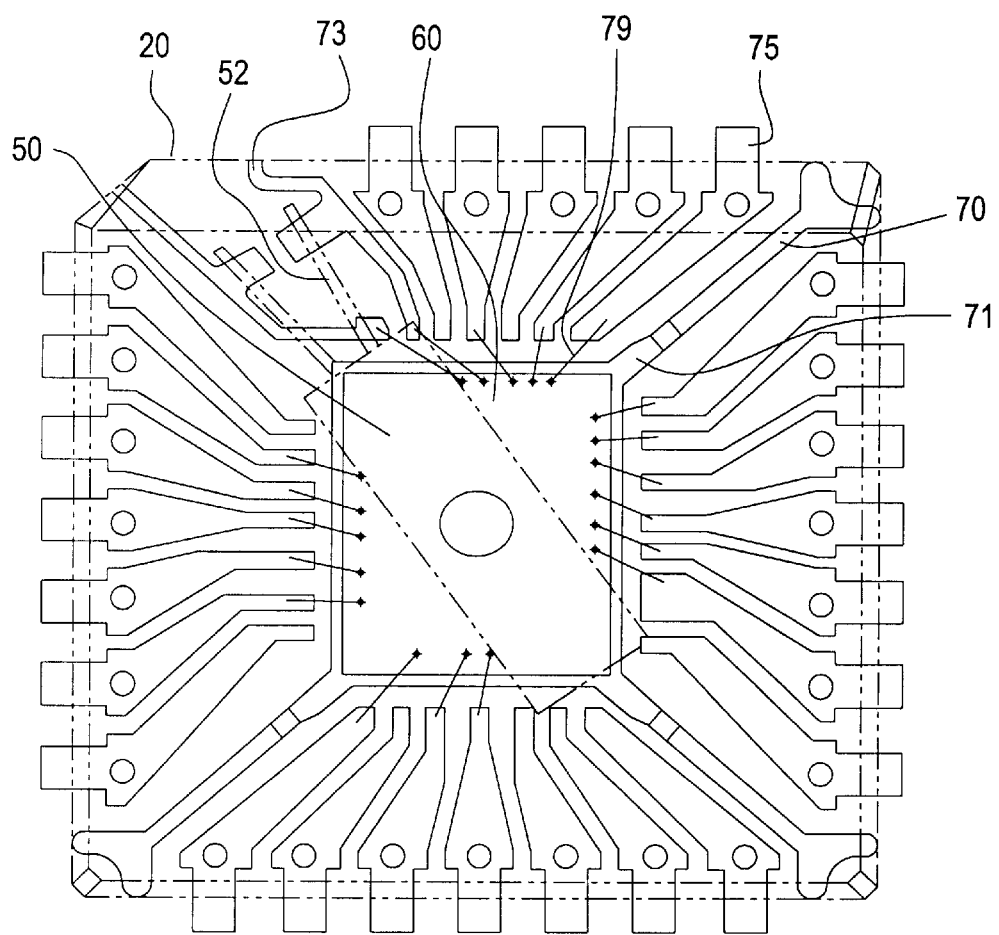
FIG. 21 is a top layout view of another piezoelectric oscillator according to the fifth embodiment of the present invention.
Figure 22:
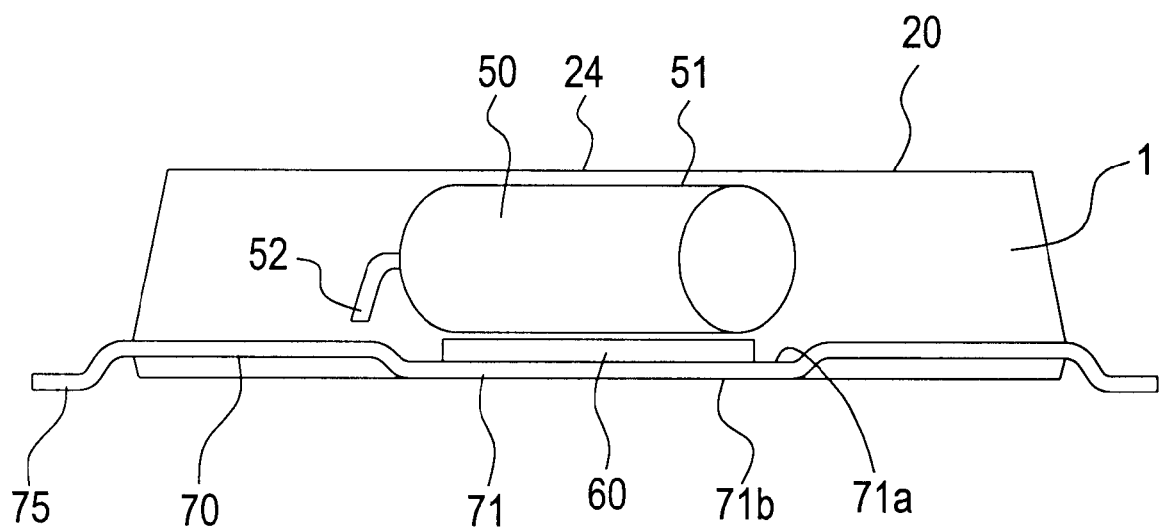
FIG. 22 is a side view of the piezoelectric oscillator shown in FIG. 21.

FIGS. 21 and 22 show an example of a piezoelectric oscillator 20 according to this embodiment that has a QFP (Quad Flat Packages) shape. By disposing the cylindrical case 51 along the diagonal line as is performed in this embodiment, a QFP shape piezoelectric oscillator 20 having a small size can be provided, in which the IC chip 60 and the resonator 50 are disposed compactly. Also in the piezoelectric oscillator 20 according to this embodiment, the lead frame 70, the IC chip 60 and the resonator 50 are, in this sequential order, stacked, and the reverse surface of the island 71 is exposed so that a low and compact piezoelectric oscillator 20 can be provided which exhibits excellent heat radiation effect, that is, having a small heat resistance value. Furthermore, a QFJ (Quad Flat J-lead Packages) shape piezoelectric oscillator and an SOJ (Small Outline J-lead Packages) piezoelectric oscillator can be provided each having another shape and formed into a package. The height of the foregoing piezoelectric oscillator can be thinned considerably to about 2.7 mm.

Figure 23:
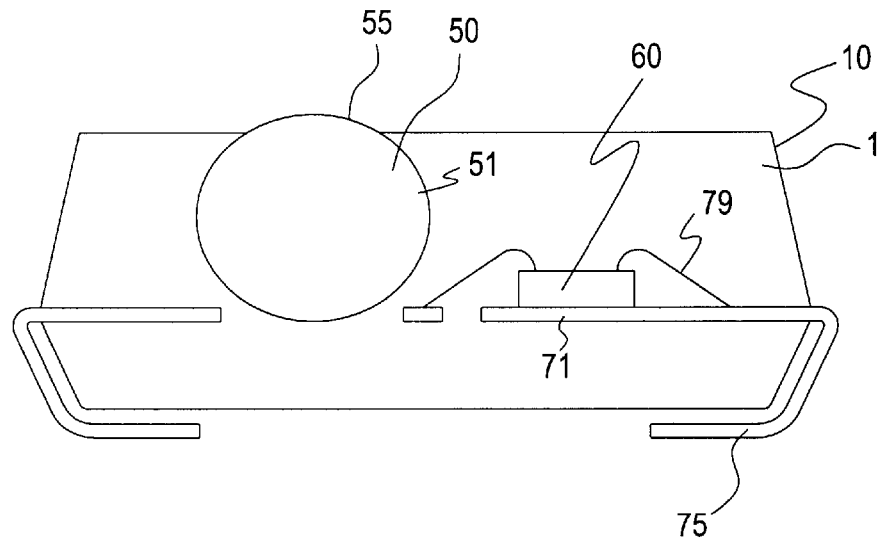
FIG. 23 is a side view of a piezoelectric oscillator according to a sixth embodiment of the present invention.
Figure 24:
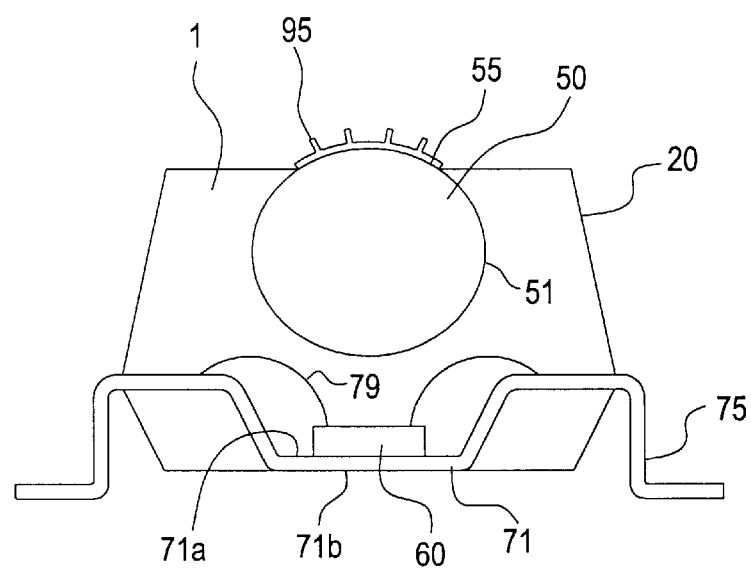
FIG. 24 is a side view of another piezoelectric oscillator.

FIGS. 23 and 24 are side views of the structure of piezoelectric oscillators 10 and 20 according to a sixth embodiment of the present invention. The piezoelectric oscillator 10 shown in FIG. 23 is an SOJ type piezoelectric oscillator, in which a resonator 50 and an IC chip 60 are disposed in parallel to each other, outer leads 75 are subjected to a bending work into a J-shape. The piezoelectric oscillator 20 shown in FIG. 24 is an SOP type piezoelectric oscillator, in which a lead frame 70, an IC chip 60 and a resonator 50 are, in this sequential order, stacked, and outer leads 75 are subjected to a bending work into a gull wing shape. Since the main structure of each of the oscillator 10 and 20 has been described in detail in the foregoing embodiments, common elements are given the same reference numerals and their description is omitted here.

In the piezoelectric oscillators 10 and 20 according to this embodiment, the upper portion of the case 51 of the resonator 51 is exposed out of the molding resin 1. In the piezoelectric oscillator 10 according to this embodiment, an exposed portion 55 of the case is limited to about one-third of the cylindrical cross section of the case so that a trouble of a type that the case 51 is out of the molding resin can be prevented. The case 51 according to this embodiment is made of copper-nickel-zinc alloy. In the SOP type piezoelectric oscillator 10 shown in FIG. 23, an exposed surface 55 of the case is applied with nickel plating. By applying nickel plating the exposed surface 55 of the case, erroneous adhesion of solder can be prevented. Therefore, if solder is melted and scattered in a reflow furnace or the like, adhesion of the solder to the surface 55 of the case can be prevented. If solder adheres in a reflow furnace or the like and as well as it separates after the mounting process, it causes short circuit or the like to take place and the reliability of the apparatus is affected. However, prevention of the adhesion as is employed in this embodiment will prevent troubles of the foregoing type.

A radiating fin 95 is, by an electroconductive adhesive or the like, attached to the exposed surface 55 of the oscillator shown in FIG. 24. Therefore, heat conducted to the case 51 can efficiently be radiated. In each of the piezoelectric oscillators 10 and 20 according to this embodiment, a portion of the case 51 of the resonator 50 is exposed out of the molding resin. As a result, heat conducted from the IC chip 60 to the case 51, and also heat accumulated in the molding resin can be radiated through the case 51. Therefore, influence of heat upon the quartz crystal resonator or a SAW resonator disposed in the case 51 can be minimized.

Figure 25A:
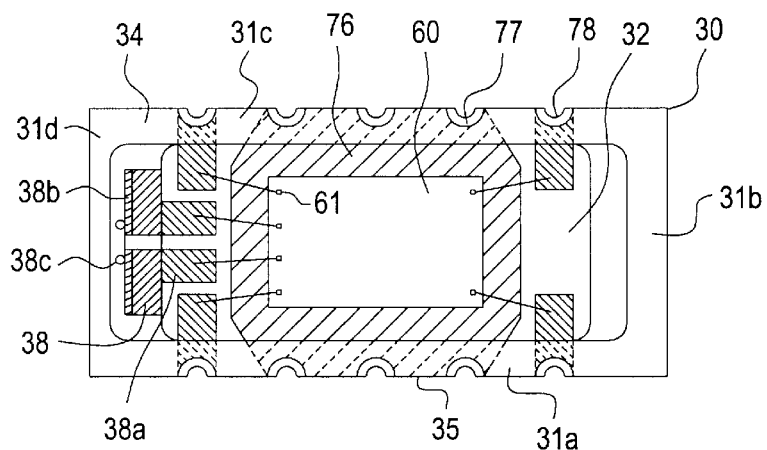
FIG. 25a is a top layout view of a piezoelectric oscillator in accordance with a seventh embodiment of the present invention.
Figure 25C:
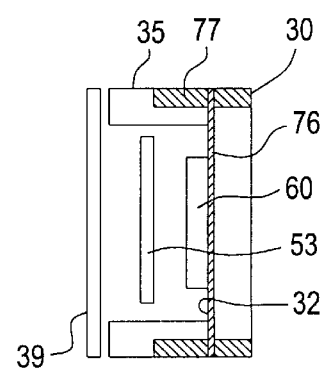
Figure 25B:
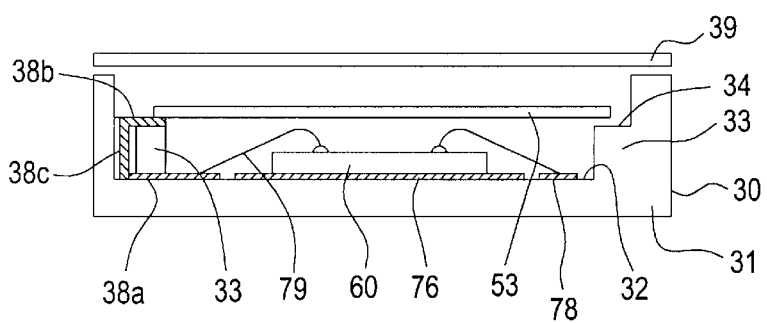

FIG. 25 shows a piezoelectric oscillator 30 according to a seventh embodiment of the present invention. In the piezoelectric oscillator 30 according to this embodiment, an IC chip 60 and a piezoelectric element 53, such as a quartz crystal resonator or a SAW resonator, are accommodated in a ceramic package 31, and a metal or ceramic cover 39 seals the foregoing elements. FIG. 25(a) is a top view of the configuration of elements in the package 31 in a state where the cover 39 and the piezoelectric element 53 have been removed. FIGS. 25(b) and (c) are side views of the configuration in the package 31. The inside portion of the package 31 according to this embodiment is sectioned into two layers. The IC chip 60 is disposed in a first layer which is in contact with a bottom surface 32 of the package 31. A stepped portion 33 is, formed by ceramic or another insulating material higher than the IC chip 60. An upper surface 34 of the stepped portion 33 is a second layer in which the piezoelectric element 53 is disposed.

The bottom surface 32, which is the first layer of the package 31, has an island pattern 76 metalized by printing. The IC chip 60 is, secured on the island pattern 76 by electroconductive adhesive. The island pattern 76 is exposed over a side surface 35 of the package 31 through two side walls 31a and 31c of the package 31, as shown in FIG. 25(c). Furthermore, the island pattern 76 is connected to a portion of a plurality of terminals 77 provided for the side surface 35 of the package. Therefore, heat generated in the IC chip 60 is conducted by the island pattern 76 to the side surface 35 of the package so as to be radiated. Since the island pattern 76 is connected to terminals 77, the terminals 77 can be connected to the radiating pattern provided for the substrate when mounting is performed. As a result, heat generated in the IC chip 60 is conducted from the terminals 77 to the substrate so that heat is efficiently radiated. Since the island pattern 76 to be provided for the bottom surface 32 of the package can be formed by a printing method, a wide pattern can easily be obtained. As a matter of course, the pattern may be formed by metal foil, and thus the method of manufacturing the pattern is not limited to the foregoing method.

The bottom surface 32 has, in addition to the island pattern 76, input/output lead patterns 78 so formed by printing or the like as to be connected to the terminals 77 on the side surface. Electrodes 61 of the IC chip and the foregoing patterns 78 are connected to one another by the wire bonding lines 79.

Furthermore, connection lead patterns 38 for establishing the connection between the piezoelectric device 53 disposed in the second layer and the IC chip 60 to each other are formed from the bottom surface 32 to the second layer 34. In the piezoelectric oscillator 30 according to this embodiment, two connection lead patterns 38 are provided for the stepped portion 33 of the package for establishing the connection between the piezoelectric element 53 and the IC chip 60 to each other. The connection lead pattern 38 comprises a wide pattern 38a for establishing the connection with the IC chip 60 disposed in the first layer 32; and a wide pattern 38b so formed in the second layer 34 as to establish the connection with the piezoelectric element 53. The foregoing patterns 38a and 38b are connected to each other by a thin electroconductive pattern 38c inserted into the stepped portion 33. Therefore, even if heat is conducted from the IC chip 60 to the pattern 38a through the wire bonding lines 79, the thin electroconductive pattern 38c prevents easy conduction of heat to the pattern 38b in the second layer.

In the piezoelectric oscillator 30 according to this embodiment in which the IC chip and the piezoelectric device are sealed in the ceramic package, heat generated in the IC chip is efficiently radiated to the outside of the package through the island pattern 76. Furthermore, the thin electroconductive passage 38c prevents easy heat conduction to the piezoelectric element 53. Therefore, even in a piezoelectric oscillator producing high frequency oscillations and having an IC chip that generates heat considerably, rise in the temperature of the IC chip can be limited to a low level. Furthermore, influence of heat upon the piezoelectric element can be minimized. As described above, the piezoelectric oscillator 30 according to this embodiment is a compact oscillator in which the semiconductor integrated circuit apparatus, such as an IC chip, and a piezoelectric element, such as a SAW resonator, are sealed. Furthermore, even if heat is generated from a semiconductor integrated circuit apparatus adapted to high frequency, excellent performance can be maintained and reliability can be maintained for a long time.

Figure 26A:
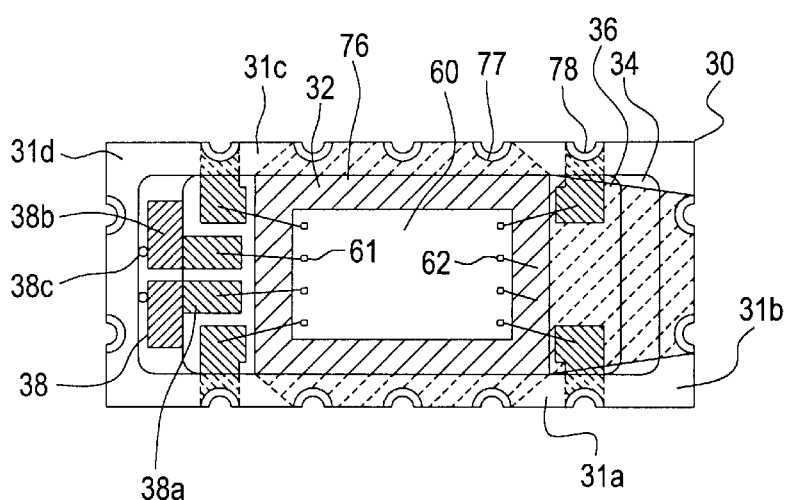
FIG. 26a is a top layout view of a piezoelectric oscillator in accordance with an eighth embodiment of the present invention.
Figure 26C:
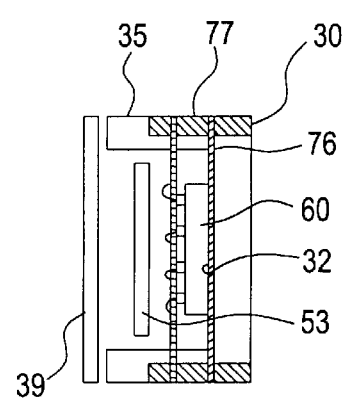
Figure 26B:
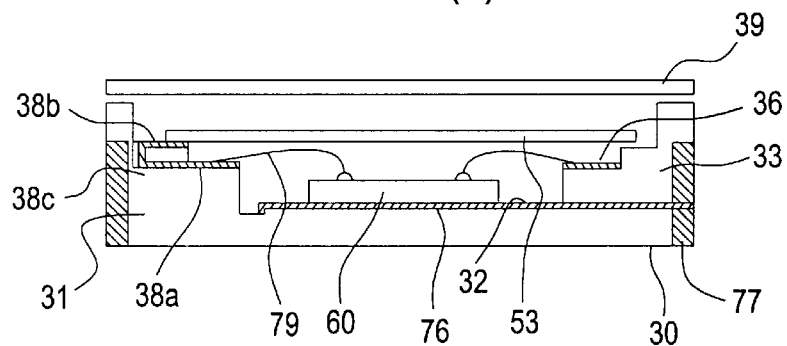
Figure 27A:
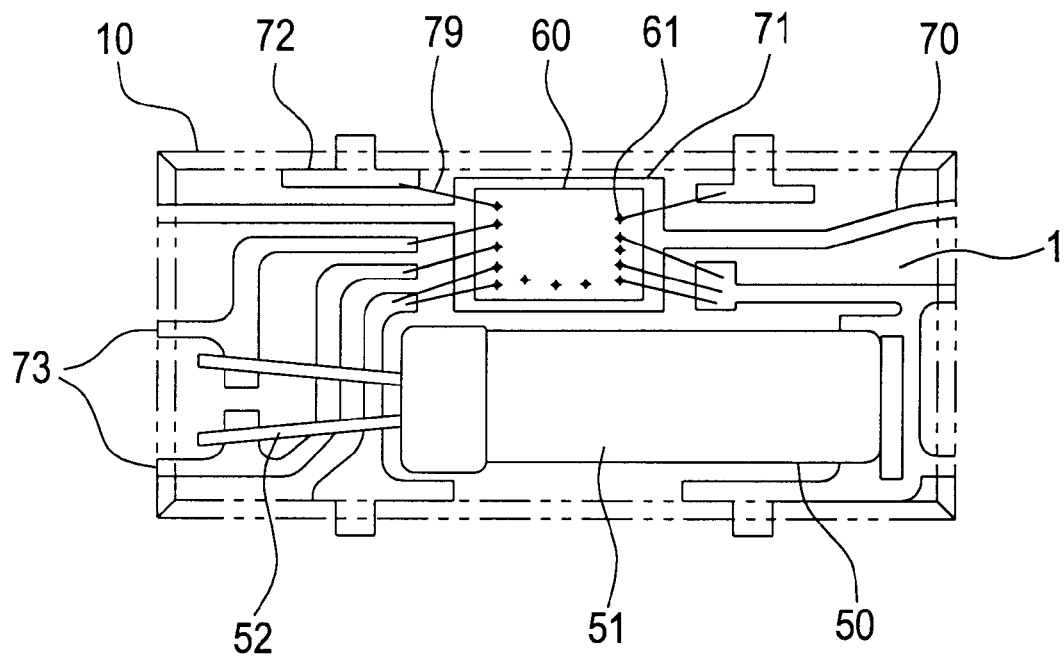
FIG. 27a is a top layout view of a piezoelectric oscillator of the prior art.
Figure 27B:
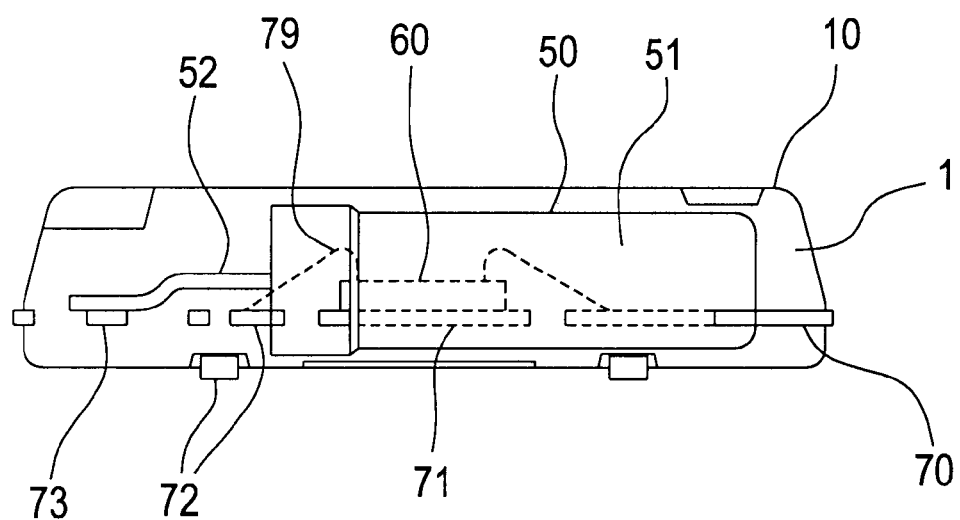
Figure 28A:
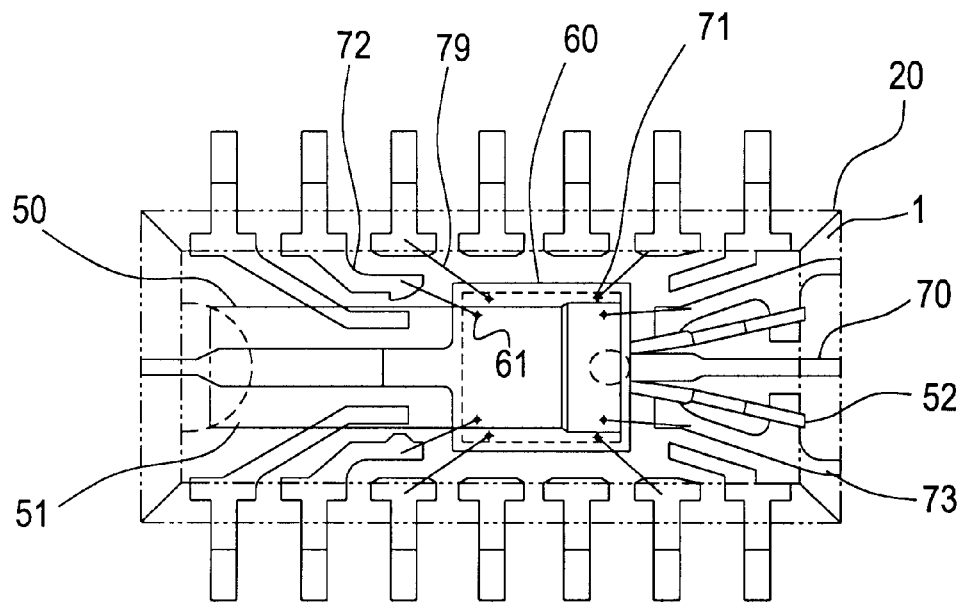
FIG. 28a is a top layout view of another piezoelectric oscillator of the prior art.
Figure 28B:
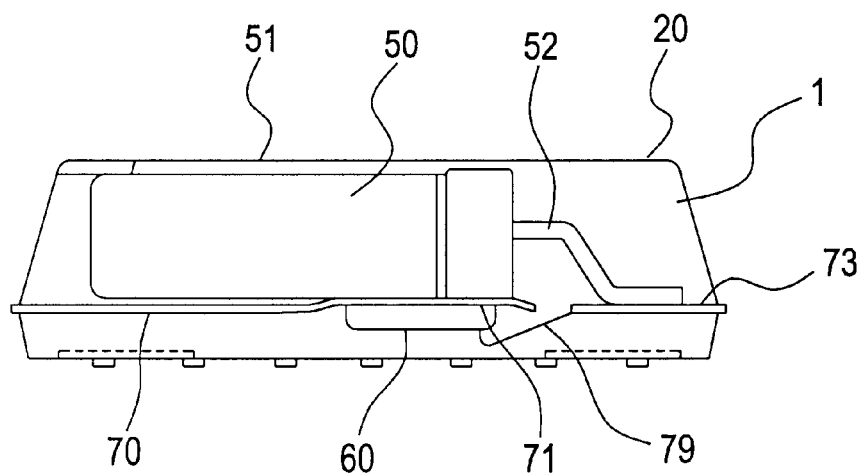
Figure 29:
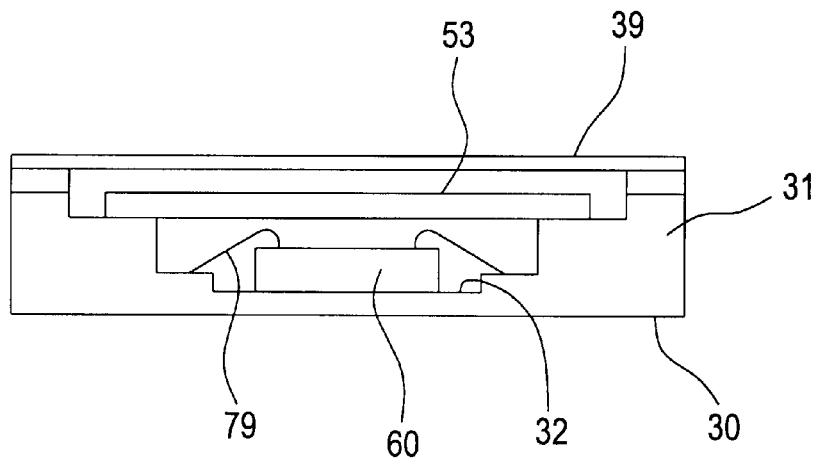
FIG. 29 is a side view showing the internal configuration of a prior art piezoelectric oscillator using a ceramic package.
Figure 30:
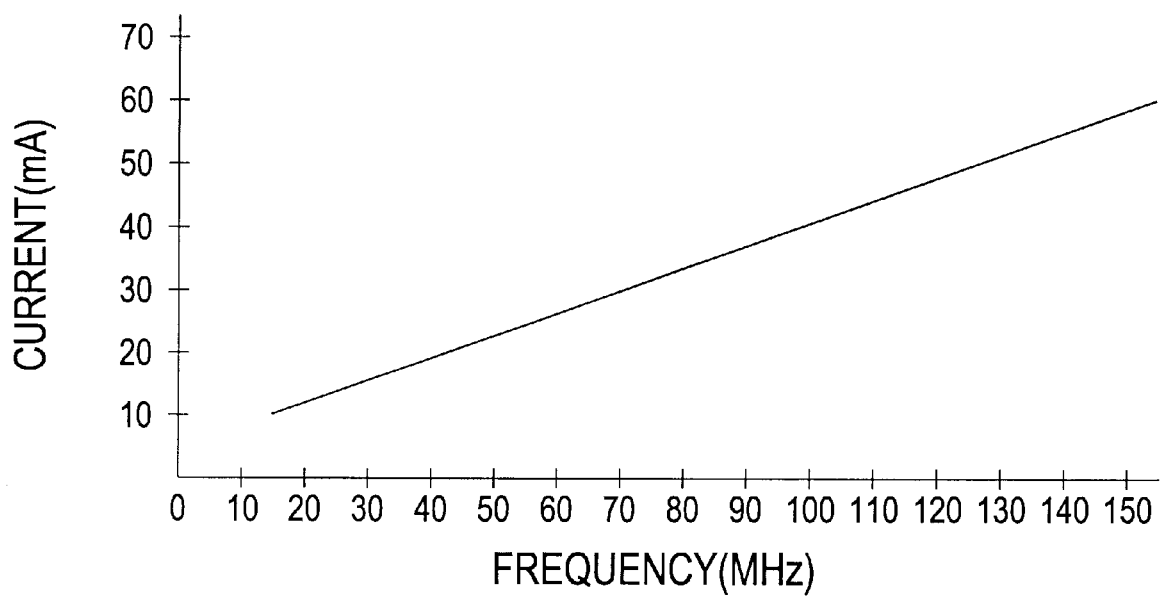
FIG. 30 is a graph showing the relationship between oscillation frequency and electric current consumption.

FIG. 26 shows a piezoelectric oscillator 30 according to this embodiment of the present invention which comprises a ceramic package that is different from that according to the foregoing embodiment. FIG. 26(a) is a top view showing the configuration of elements in a package 31 in a state where a cover 39 and a piezoelectric element 53 have been removed. FIGS. 26(b) and (c) are side views showing the configuration in the package 31. The piezoelectric oscillator 30 according to this embodiment comprises a third layer 36 having lead patterns 78 and 38 between a first layer 32 in the bottom surface of the package, in which the IC chip 60 is disposed, and a second layer in which a piezoelectric element 53 is disposed on the stepped portion 33. That is, the side wall of the ceramic package 31 according to this embodiment has the stepped portion 33 consisting of two stepped portions, and the surface of the intermediate step is used as the third layer 36.

The piezoelectric oscillator 30 according to this embodiment comprises the third layer 36 for forming the input/output and connection lead patterns 78 and 38 which is a layer different from the first layer 32 in which the IC chip 60 is disposed. Therefore, the necessity of providing a space for forming the lead patterns for the first layer 32 can be eliminated so that the island pattern 76 is formed into an arbitrary shape. For example, the island pattern 76 can be extended in any of the four directions of the first layer to penetrate all side walls 31a to 31d so as to be exposed on the side surfaces so that an excellent heat radiation effect is obtained. In this embodiment, influence of heat indirectly conducted to the connection pattern 38 upon the piezoelectric device 53 is minimized by inhibiting extension of the island pattern 76 in a direction toward the side wall 31d having the connection pattern 38 formed therein, but the same is caused to penetrate the residual three wall surfaces so that an excellent heat radiation effect is obtained.

Since the layer for the input/output pattern and the connection pattern is individually formed in the piezoelectric oscillator 30 according to this embodiment, the foregoing patterns can easily be designed so as to enable patterns to be made adaptable to the configuration of electrodes in the IC chip. Dummy electrodes 62 may be provided for the IC chip so as to be connected to the island pattern 76 by one or a plurality of bonding wires so that rise in the temperature of the IC chip adjacent to the electrodes is minimized. In place of the dummy electrodes, the island pattern may be connected to the power source portion of the substrate, followed by being connected to the power source electrode of the IC chip by a bonding wire. Since the island pattern 76 has a wide area and is able to lower the impedance of the power supply line, the power supply portion is given a margin. As a matter of course, the island pattern 76 may be made the grounded portion. As described with reference to FIG. 2, it may be connected to the control electrode of the IC chip 60.

As described in the foregoing embodiments, the piezoelectric oscillator according to the present invention enables heat generated in the semiconductor integrated circuit apparatus, such as the IC chip, to be efficiently radiated to the outside of the piezoelectric oscillator. Furthermore, heat to be conducted to the oscillator and the piezoelectric device packaged together with the semiconductor integrated circuit apparatus can be minimized. In addition, heat radiation from the case of the resonator and the like to the outside of the piezoelectric oscillator is enabled. As described above, according to the present invention, a piezoelectric oscillator can be provided, the size and thickness of which can be reduced, which has a low heat resistance, which is capable of preventing a problem due to heat, and the cost of which can be reduced. Since the piezoelectric oscillator according to the present invention is able to overcome the problems of rise in the temperature and unsatisfactory stability of the operation thereof. Therefore, a piezoelectric oscillator can be formed by using a piezoelectric element, such as the SAW resonator which is capable of obtaining stable oscillations with high frequencies. Thus, a small piezoelectric oscillator for supplying signals in a high frequency range from 100 MHz to 500 MHz can be provided practically. Although the invention has been described in its preferred form, it is understood that the present disclosure of the preferred form can be changed in the details of construction and the combination and arrangement of parts may be resorted to without departing from the spirit and the scope of the invention as hereinafter claimed. The piezoelectric oscillator according to present invention is not limited to the combinations described in the foregoing embodiments, and it may be realized in any of a variety of combinations.

The piezoelectric oscillator according to the present invention relates to a device for supplying clock signals to electronic equipment, and to a surface mounting device, such as a real time clock module or a PLL module, having combined functions, and is preferably employed in an electronic equipment, the size of which will be reduced and the operation speed of which will be raised in the future.

What is claimed is:

1. A piezoelectric oscillator comprising a resonator, in which a piezoelectric element is sealed in a case thereof, and a semiconductor integrated circuit apparatus disposed on an island of a lead frame in such a manner that said semiconductor integrated circuit apparatus is electrically connected to said resonator, and said semiconductor integrated circuit apparatus and said lead frame are integrally molded by molding resin, wherein at least one of said island and said case is connected to a radiating portion exposed to the outside of said molding resin.

2. A piezoelectric oscillator according to claim 1, wherein the radiating portion comprises a radiating lead extending to the outside of said molding resin that is connected to at least one of said island and said case.

3. A piezoelectric oscillator according to claim 2, further comprising a plurality of holes disposed along the edge of said molding resin and formed in a portion of said radiating lead that extends to the outside of said molding resin.

4. A piezoelectric oscillator according to claim 2, wherein an elongated hole extends along the edge of said molding resin and is formed in a portion of said radiating lead that is on the inside of said molding resin.

5. A piezoelectric oscillator according to claim 2, wherein said radiating lead is molded integrally with said island.

6. A piezoelectric oscillator according to claim 2, wherein said radiating lead is soldered to said case.

7. A piezoelectric oscillator according to claim 2, wherein said radiating lead is bonded to said case.

8. A piezoelectric oscillator according to claim 1, wherein the radiating portion comprises a radiating plate in contact with at least one of said island and said case, and at least a portion of said radiating plate is exposed outside said molding resin.

9. A piezoelectric oscillator according to claim 8, wherein said radiating plate is secured to the at least one of said island and said case by said molding resin.

10. A piezoelectric oscillator according to claim 1, wherein at least a portion of at least one of said island and said case is exposed to the outside of said molding resin.

11. A piezoelectric oscillator according to claim 10, wherein said case is cylindrical and about one-third of the case is exposed outside the molding resin.

12. A piezoelectric oscillator according to claim 10, wherein a portion of said case is exposed outside the molding resin, and nickel plating is applied to the surface of an exposed portion of said case.

13. A piezoelectric oscillator according to claim 10, wherein a portion of said case is exposed outside the molded resin, and a radiating fin is attached to the surface of an exposed portion of said case.

14. A piezoelectric oscillator according to claim 1, wherein said semiconductor integrated circuit apparatus further comprises at least one dummy electrode wire-bonded to a portion of said lead frame.

15. A piezoelectric oscillator according to claim 1, wherein said semiconductor integrated circuit apparatus further comprises a plurality of control pads for controlling oscillation frequency, the number of said control pads connected to said lead frame being directly proportional to the oscillation frequency.

16. A piezoelectric oscillator according to claim 1, wherein said semiconductor integrated circuit apparatus is an IC for a real time clock.

17. A piezoelectric oscillator according to claim 1, wherein said semiconductor integrated circuit apparatus is an IC for PLL.

18. A piezoelectric oscillator according to claim 1, wherein said piezoelectric element is a quartz crystal resonator.

19. A piezoelectric oscillator according to claim 1, wherein said piezoelectric element is a SAW resonator.

20. A piezoelectric oscillator according to claim 10, wherein said semiconductor integrated circuit apparatus is stacked on said island and said resonator is stacked on said semiconductor integrated circuit apparatus.

21. A piezoelectric oscillator according to claim 20, wherein said island of said lead frame has a portion of a first surface on which said semiconductor integrated circuit apparatus is disposed, wherein the portion is vertically displaced below other portions of the first surface of said lead frame by an amount at least corresponding to the thickness of said semiconductor integrated circuit apparatus, wherein at least a portion of a second surface of said island opposing said semiconductor integrated circuit apparatus is exposed outside the molding resin.

22. A piezoelectric oscillator comprising a resonator, in which a piezoelectric device is sealed in a case thereof, a semiconductor integrated circuit apparatus electrically connected to said resonator, wherein said semiconductor integrated circuit apparatus and said resonator are molded parallel to each other by molding resin,
    wherein said semiconductor integrated circuit apparatus is thinner than said case, wherein a portion of said molding resin that covers said semiconductor integrated circuit apparatus is concave and a heat sink attached to said concave portion.

23. A piezoelectric oscillator according to claim 22, wherein said concave portion extends to a position near said case, and said heat sink is adjacent to said case.

24. A piezoelectric oscillator according to claim 22, wherein said semiconductor integrated circuit apparatus is an IC for a real time clock.

25. A piezoelectric oscillator according to claim 22, wherein said semiconductor integrated circuit apparatus is an IC for PLL.

26. A piezoelectric oscillator according to claim 22, wherein said piezoelectric element is a quartz crystal resonator.

27. A piezoelectric oscillator according to claim 22, wherein said piezoelectric device is a SAW resonator.

28. A piezoelectric oscillator comprising a resonator, in which a piezoelectric element is sealed in a case thereof, and a semiconductor integrated circuit apparatus electrically connected to said resonator by resonator leads extending through said case that are connected to connection leads that are connected to said semiconductor integrated circuit apparatus, wherein said semiconductor integrated circuit apparatus and said resonator are integrally molded by molding resin,
    wherein at least a portion of at least one of said resonator leads and said connection leads is connected to a radiating portion exposed to the outside of said molding resin.

29. A piezoelectric oscillator according to claim 28, further comprising a plurality of holes disposed along the edge of said molding resin in a portion of said radiating portion on the outside of said molding resin.

30. A piezoelectric oscillator according to claim 28, wherein an elongated hole extending along the edge of said molding resin in a portion of said radiating portion on the inside of said molding resin.

31. A piezoelectric oscillator according to claim 28, wherein said piezoelectric element is a quartz crystal resonator.

32. A piezoelectric oscillator according to claim 28, wherein said piezoelectric device is a SAW resonator.

33. A piezoelectric oscillator comprising a resonator, in which a piezoelectric element is sealed in a case thereof, and a semiconductor integrated circuit apparatus is electrically connected to said resonator by resonator leads extending through said case that are connected to connection leads that are connected to said semiconductor integrated circuit apparatus, wherein said semiconductor integrated circuit apparatus and said resonator are integrally molded by molding resin,
    wherein an electroconductive passage consisting of said resonator leads and said connection leads has a portion disposed adjacently to the surface of said molding resin.

34. A piezoelectric oscillator according to claim 33, wherein said resonator leads extend to a position adjacent to the surface of said molding resin.

35. A piezoelectric oscillator according to claim 33, wherein a portion of said connection leads extends to a position adjacent to the surface of said molding resin.

36. A piezoelectric oscillator according to claim 33, wherein said piezoelectric element is a quartz crystal resonator.

37. A piezoelectric oscillator according to claim 33, wherein said piezoelectric device is a SAW resonator.

38. A piezoelectric oscillator comprising a resonator including a piezoelectric element; and a semiconductor integrated circuit apparatus electrically connected to said resonator in such a manner that said semiconductor integrated circuit apparatus and said resonator are in a ceramic package,
    wherein an island pattern for disposing said semiconductor integrated circuit apparatus is formed in a first layer in said package, and a portion of said island pattern extends to the outside of said package.

39. A piezoelectric oscillator according to claim 38, further comprising a second layer for disposing said resonator that is made of stepped-shape insulating material and is formed on said first layer, and a thin lead that penetrates said insulating material for establishing the connection between said resonator and said semiconductor integrated circuit apparatus.

40. A piezoelectric oscillator according to claim 39, further comprising a third layer made of a stepped-shape insulating material that is formed between said first layer and said second layer, and an electroconductive pattern formed in said third layer to be connected to electrodes of said semiconductor integrated circuit apparatus.

41. A piezoelectric oscillator according to claim 38, wherein said semiconductor integrated circuit apparatus has at least one dummy electrode wire-bonded to said island pattern.

42. A piezoelectric oscillator according to claim 38, wherein electric power is supplied to said island pattern, and said island pattern and a power supply electrode of said semiconductor integrated circuit apparatus are connected by wire bonding.

43. A piezoelectric oscillator according to claim 38, wherein said semiconductor integrated circuit apparatus has a plurality of control pads for controlling oscillation frequency, wherein the number of said control pads to be connected to said lead frame is directly proportional to the oscillation frequency.

44. A piezoelectric oscillator according to claim 38, wherein said semiconductor integrated circuit apparatus is an IC for a real time clock.

45. A piezoelectric oscillator according to claim 38, wherein said semiconductor integrated circuit apparatus is an IC for PLL.

46. A piezoelectric oscillator according to claim 38, wherein said piezoelectric element is a quartz crystal resonator.

47. A piezoelectric oscillator according to claim 38, wherein said piezoelectric device is a SAW resonator.

48. A piezoelectric oscillator comprising a resonator, in which a piezoelectric device is sealed in a case thereof, and a semiconductor integrated circuit apparatus disposed on an island of a lead frame in such a manner that said semiconductor integrated circuit apparatus is electrically connected to said resonator, wherein said semiconductor integrated circuit apparatus is stacked on said island of said lead frame and said resonator is stacked on said semiconductor integrated circuit apparatus and are integrally molded by molding resin.

49. A piezoelectric oscillator according to claim 48, wherein said island has a portion of a first surface on which said semiconductor integrated circuit apparatus is disposed, wherein the portion is vertically displaced below the other portions of the first surface of said lead frame by an amount at least corresponding to the thickness of said semiconductor integrated circuit apparatus.

* * * * *